United States Patent
Tatum et al.

(10) Patent No.: US 10,396,529 B2
(45) Date of Patent: Aug. 27, 2019

(54) VCSELS HAVING MODE CONTROL AND DEVICE COUPLING

(71) Applicant: Finisar Corporation, Sunnyvale, CA (US)

(72) Inventors: Jim Tatum, Plano, TX (US); Gary Landry, Allen, TX (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 15/986,297

(22) Filed: May 22, 2018

(65) Prior Publication Data

US 2018/0337516 A1 Nov. 22, 2018

Related U.S. Application Data

(60) Provisional application No. 62/509,352, filed on May 22, 2017.

(51) Int. Cl.
*H01S 5/10* (2006.01)
*H01S 5/20* (2006.01)
(Continued)

(52) U.S. Cl.
CPC ............ *H01S 5/423* (2013.01); *H01S 5/0425* (2013.01); *H01S 5/1003* (2013.01); *H01S 5/187* (2013.01); *H01S 5/18333* (2013.01); *H01S 5/18338* (2013.01); *H01S 5/18361* (2013.01); *H01S 5/343* (2013.01); *H01S 5/0261* (2013.01); *H01S 5/0264* (2013.01); *H01S 5/06825* (2013.01); *H01S 5/1021* (2013.01); *H01S 5/18308* (2013.01); *H01S 5/18358* (2013.01);
(Continued)

(58) Field of Classification Search
CPC ............ H01S 2301/20; H01S 2304/02; H01S 5/2086; H01S 5/18361; H01S 5/18338; H01S 5/18333; H01S 5/187; H01S 5/068; H01S 5/42; H01S 5/1021; H01S 5/343
See application file for complete search history.

(56) References Cited

U.S. PATENT DOCUMENTS

2011/0164645 A1* 7/2011 Shi ................. H01S 5/0261
372/50.11
2014/0055790 A1* 2/2014 Inao ................. H01S 5/06
356/479

(Continued)

*Primary Examiner* — Tuan N Nguyen
(74) *Attorney, Agent, or Firm* — Maschoff Brennan

(57) ABSTRACT

A VCSEL can include: an active region configured to emit light; a blocking region over or under the active region, the blocking region defining a plurality of channels therein; a plurality of conductive channel cores in the plurality of channels of the blocking region, wherein the plurality of conductive channel cores and blocking region form an isolation region; a top electrical contact; and a bottom electrical contact electrically coupled with the top electrical contact through the active region and plurality of conductive channel cores. At least one conductive channel core is a light emitter, and others can be spare light emitters, photodiodes, modulators, and combinations thereof. A waveguide can optically couple two or more of the conductive channel cores. In some aspects, the plurality of conductive channel cores are optically coupled to form a common light emitter that emits light (e.g., single mode) from the plurality of conductive channel cores.

20 Claims, 12 Drawing Sheets

(51) Int. Cl.
*H01S 5/183* (2006.01)
*H01S 5/42* (2006.01)
*H01S 5/042* (2006.01)
*H01S 5/187* (2006.01)
*H01S 5/343* (2006.01)
H01S 5/026 (2006.01)
H01S 5/068 (2006.01)

(52) U.S. Cl.
CPC ........... *H01S 5/2063* (2013.01); *H01S 5/2086* (2013.01); *H01S 2301/166* (2013.01); *H01S 2301/20* (2013.01); *H01S 2304/02* (2013.01); *H01S 2304/04* (2013.01)

(56) References Cited

U.S. PATENT DOCUMENTS

| | | | |
|---|---|---|---|
| 2018/0041009 A1 | 2/2018 | Graham et al. | |
| 2018/0070423 A1* | 3/2018 | Kondo | G02F 1/3515 |
| 2018/0090909 A1 | 3/2018 | Graham et al. | |

* cited by examiner

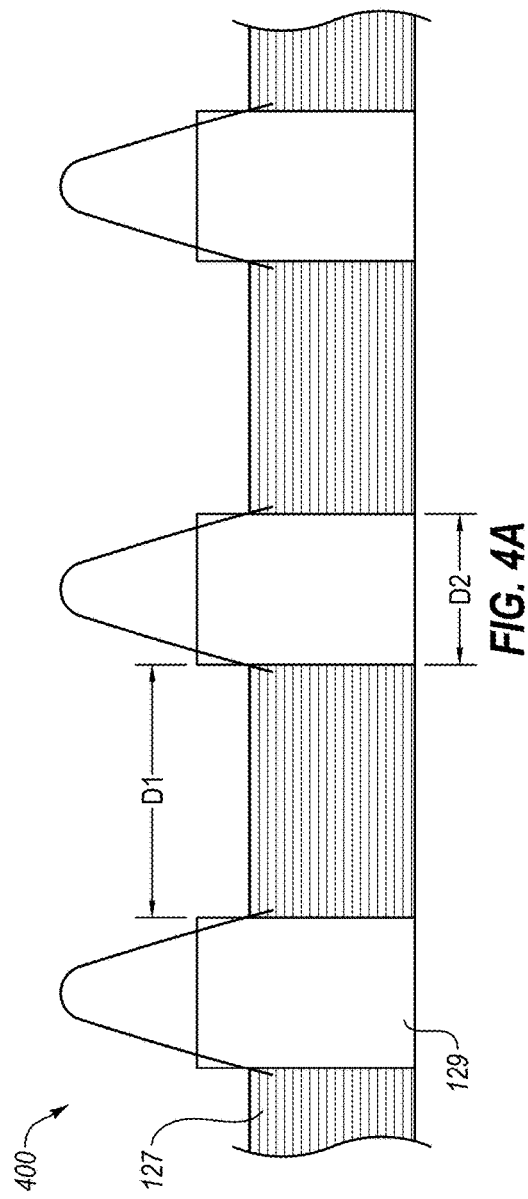
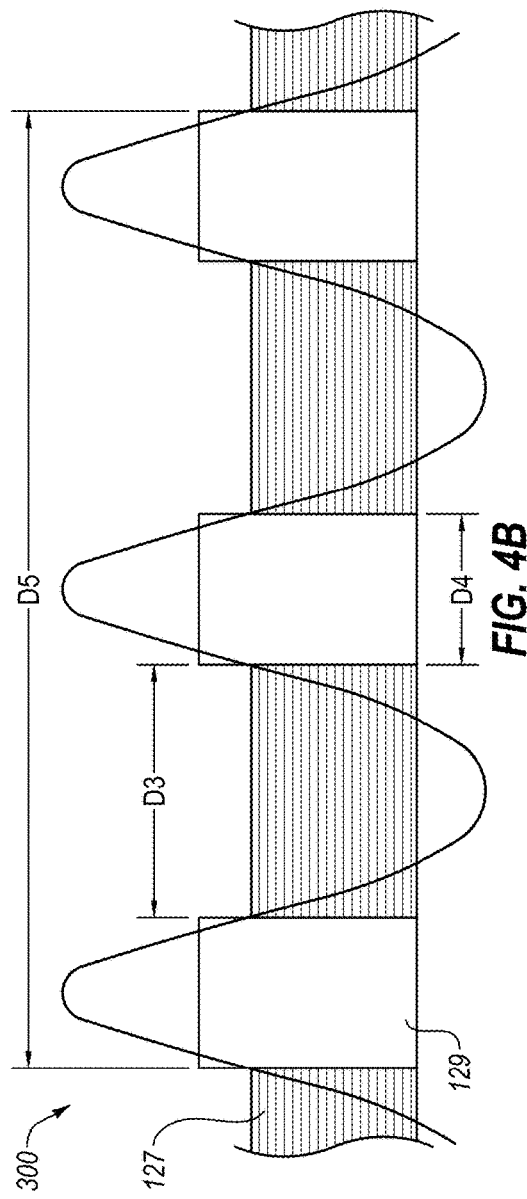

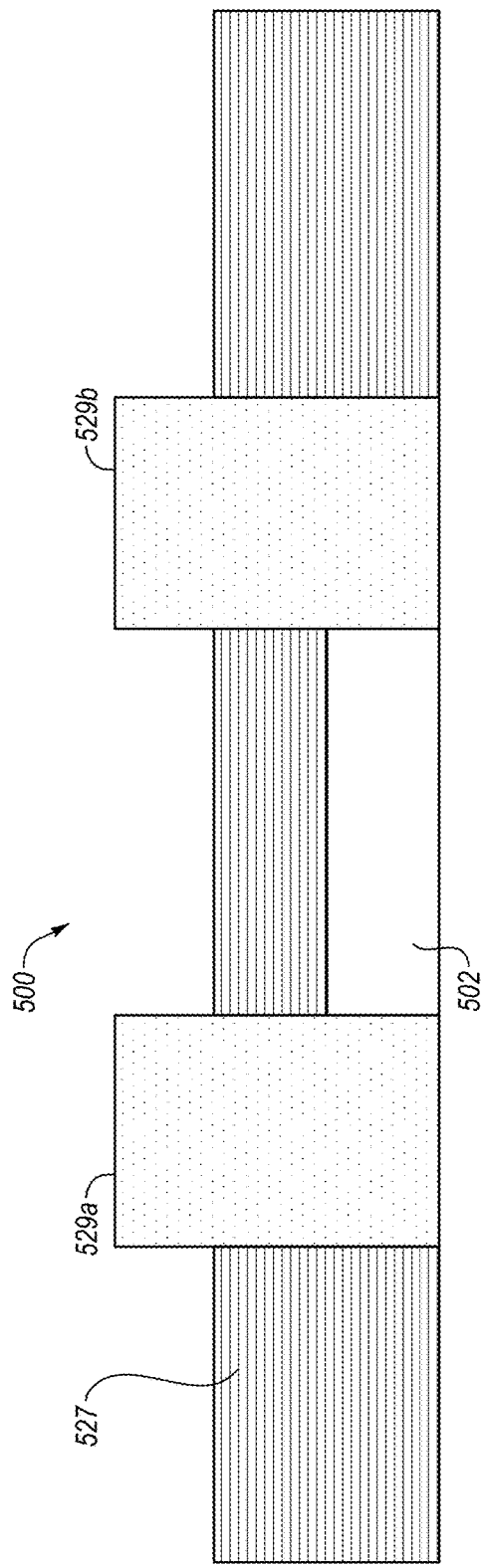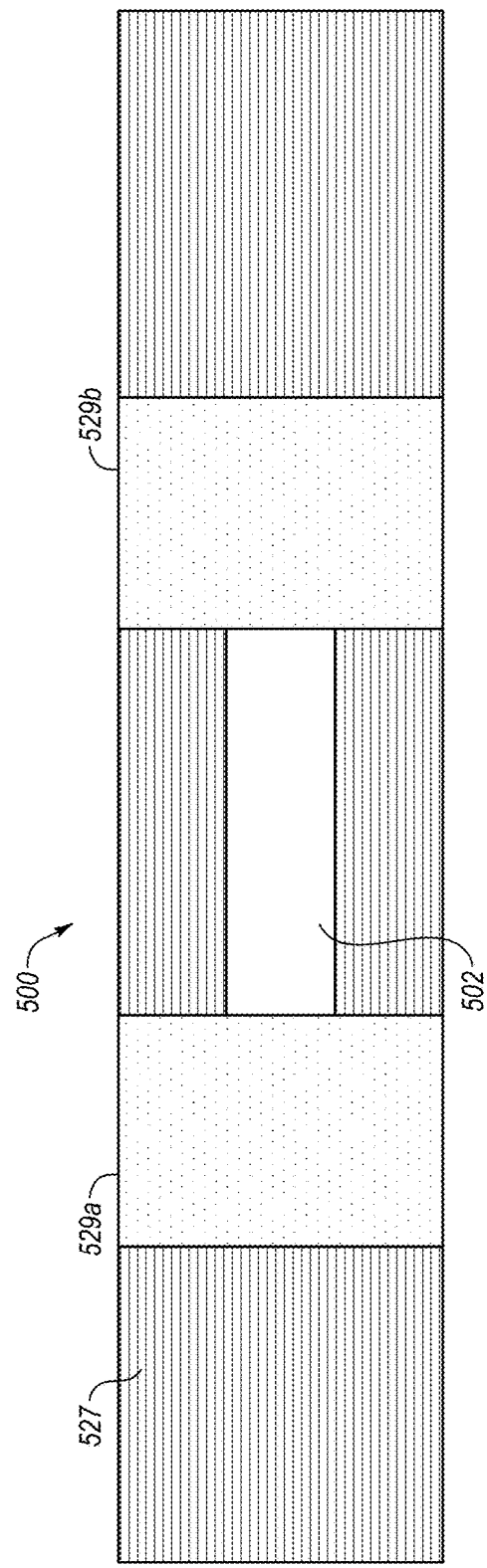

VCSELS HAVING MODE CONTROL AND DEVICE COUPLING

CROSS-REFERENCE

This patent application claims priority to U.S. Provisional Application No. 62/509,352 filed May 22, 2017, which provisional is incorporated herein by specific reference in its entirety.

BACKGROUND

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g., one p-type mirror and one n-type mirror). Notably, the notion of top and bottom mirrors can be somewhat arbitrary. In some configurations, light could be extracted from the wafer side of the VCSEL, with the "top" mirror totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current the injected minority carriers form a population inversion in the quantum wells that produces optical gain. Optical gain occurs when photons in the active region stimulate electrons to recombine with holes in the conduction band to the valance band which produces additional photons. When the optical gain exceeds the total loss in the two mirrors, laser oscillation occurs.

The active region may also include an oxide aperture formed using one or more oxide layers formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to 'lase' as the optically coherent photons are emitted from the top of the VCSEL.

U.S. Pat. No. 8,774,246 describes light emitting devices with a current blocking region formed using a depleted semiconductor heterojunction interface. Using this type of heterojunction interface for blocking allows a conductive channel to be formed by applying location selective specific doping changes either to the blocking region, or to the center conductive region itself. In this approach, doping is delivered via a diffusion mechanism.

Zhou et al. (D. Zhou and L. J. Mawst, "High-Power Single-Mode Antiresonant Reflecting Optical Waveguide-Type Vertical-Cavity-Surface-Emitting Lasers," IEEE Journal of Quantum Electronics, 58, no 12, 1599-1606 (2002)) describes light emitting devices that use a heterojunction current blocking region and a center etched conductive channel, but the subsequent regrowth used in this design is not planarizing and does not form an index guiding optical mode in the center channel of the device. Instead, antiresonant devices with larger, optical modes that can leak to the adjacent area are formed. While this may be useful for very large emitters or closely placed arrays, the design approach is not desirable for single high optical output efficiency and high modulation bandwidth VCSELs.

In Chriovsky et al. (L. M. F. Chriovsky, W. S. Hobson, R. E. Leibenguth, S. P. Hui, J. Lopata, G. J. Zydzik, G. Giaretta, K. W. Goossen, J. D. Wynn, A. V. Krishnamoorthy, B. J. Tseng, J. M. Vandenberg, L. A. D'Asaro, "Implant-Apertured and Index-Guided Vertical-Cavity-Surface-Emitting Lasers ($I^2$-VCSELs)," IEEE Photonics Technology Letters, 11, no 5, 500-502 (1999)) the current blocking region is formed by ion implantation damage, and not through use of a low doped hetero-junction. The index guided optical mode is formed via an etched mesa as in U.S. Pat. No. 8,774,246.

The subject matter claimed herein is not limited to embodiments that solve any disadvantages or that operate only in environments such as those described above. Rather, this background is only provided to illustrate one example technology where some embodiments described herein may be practiced.

SUMMARY

In some embodiments, a vertical cavity surface emitting laser (VCSEL) can include: an active region configured to emit light; a blocking region over or under the active region, the blocking region defining a plurality of channels therein; a plurality of conductive channel cores in the plurality of channels of the blocking region, wherein the plurality of conductive channel cores and blocking region form an isolation region; a top electrical contact; and a bottom electrical contact electrically coupled with the top electrical contact through the active region and plurality of conductive channel cores. In some aspects, the plurality of conductive channel cores are located between and electrically coupled with the top electrical contact and bottom electrical contact. In some aspects, the plurality of conductive channel cores are optically coupled so as to form a common light emitter that emits light (e.g., single mode) from the plurality of conductive channel cores.

In some embodiments, a VCSEL can include a first laser emitter and a second laser emitter. The first laser emitter can have: a first active region configured to emit light; a first blocking region over or under the first active region, the first blocking region defining one or more first channels therein; and one or more first conductive channel cores in the one or more first channels of the first blocking region. In some aspects, the one or more first conductive channel cores and first blocking region form a first isolation region. The second laser emitter can have: a second active region configured to emit light; a second blocking region over or under the second active region and lateral of the first blocking region, the second blocking region defining one or more second channels therein; and one or more second conductive channel cores in the one or more second channels of the second blocking region. In some aspects, one or more second conductive channel cores and second blocking region form a second isolation region lateral of the first isolation region. In some aspects, the VCSEL includes a waveguide extending between and optically coupling the first laser emitter and second laser emitter.

In some embodiments, a VCSEL can include a first laser emitter and a second laser emitter. In some aspects, the first laser emitter can have: a first active region configured to emit light; a first blocking region over or under the first active region, the first blocking region defining one or more first channels therein; and one or more first conductive channel cores in the one or more first channels of the first blocking region. In some aspects, the one or more first conductive channel cores and first blocking region form a first isolation region. In some aspects, the second laser emitter can have: a second active region configured to emit light; a second blocking region over or under the second active region and lateral of the first blocking region, the second blocking region defining one or more second channels therein; and one or more second conductive channel cores in the one or more second channels of the second blocking region. In some aspects, the one or more second conductive channel cores and second blocking region form a second isolation region lateral of the first isolation region. In some aspects, the VCSEL includes a redundancy switch operably coupled with the first laser emitter and second laser emitter so that only one is operational. In some aspects, when the first laser emitter is operational, the second laser emitter is a backup. Alternatively, when the first laser emitter is degraded or defective, the second laser emitter is operational.

In some embodiments, a VCSEL can include a laser emitter and a photodetector. The laser emitter can include: a first active region configured to emit light; a first blocking region over or under the first active region, the first blocking region defining one or more first channels therein; and one or more first conductive channel cores in the one or more first channels of the first blocking region, wherein the one or more first conductive channel cores and first blocking region form a first isolation region. The VCSEL can include a photodetector configured as a monitor. The photodetector can include: a second active region configured for detecting light; a second blocking region over or under the second active region and lateral of the first blocking region, the second blocking region defining one or more second channels therein; and one or more second conductive channel cores in the one or more second channels of the second blocking region. In some aspects, the one or more second conductive channel cores and second blocking region form a second isolation region lateral of the first isolation region. The VCSEL can also include a waveguide extending between and optically coupling the laser emitter and photodetector.

In some embodiments, a VCSEL can include a laser emitter and a waveguide. The laser emitter can have: a first active region configured to emit light; a first blocking region over or under the first active region, the first blocking region defining one or more first channels therein; one or more first conductive channel cores in the one or more first channels of the first blocking region, wherein the one or more first conductive channel cores and first blocking region form a first isolation region. The VCSEL can include a light modulator having: a second active region configured for changing refractive index and/or absorption so as to function as a light modulator; a second blocking region over or under the active region and lateral of the first blocking region, the second blocking region defining one or more second channels therein; and one or more second conductive channel cores in the one or more second channels of the second blocking region. In some aspects, the one or more second conductive channel cores and second blocking region form a second isolation region lateral of the first isolation region. In some aspects, the waveguide is positioned to extend between and optically couple the first active region of the laser emitter and a second active region of the light modulator.

The above VCSEL embodiments can have various configurations. In some aspects, the VCSEL can include a bottom mirror region below the active region, and a top mirror region above the isolation region. In some aspects, the VCSEL can include a non-planarized bottom mirror region below the active region, and a non-planarized top mirror region above the isolation region.

In some aspects, the VCSEL can include a bottom spacer region between the bottom mirror region and active region, and a top spacer region between the active region and blocking region. In some aspects, the VCSEL can include the conductive channel core extending through the blocking region and contacting the active region. In some aspects, the VCSEL can include the conductive channel core extending through the blocking region and contacting the top spacer region.

In some aspects, the VCSEL can include the blocking region having a thickness from 1 nm to 500 nm, from 1 nm to 30 nm, from 1 nm to 10 nm, or from 1 nm to 3 nm. In some aspects, the VCSEL can include the conductive channel core having a thickness from 1 nm to 1000 nm, from 1 nm to 60 nm, from 1 nm to 20 nm, or from 1 nm to 6 nm. In some aspects, the VCSEL can include the conductive channel core having a thickness the same as the blocking region. In some aspects, the VCSEL can include the conductive channel core having a diameter of about 0.5 microns to about 10 microns. In some aspects, the VCSEL can include the conductive channel core having a diameter of about 2 microns to about 6 microns.

In some embodiments, the VCSEL can include a plurality of different sets of the plurality of the conductive channel cores in a common blocking region. In some aspects, the plurality of conductive channel cores of each set are electrically coupled with a common electrical source and optically coupled so as to form a common light emitter that emits light from the plurality of conductive channel cores. In some aspects, the conductive channel cores of different sets are electronically isolated and operated separately.

In some aspects, the VCSEL can include the conductive channel core having a higher refractive index than the blocking region. In some aspects, the VCSEL can include the blocking region having a lower refractive index than the conductive channel core. In some aspects, the VCSEL can include the conductive channel core having a refractive index from about 3.7 to 3. In some aspects, the VCSEL can include the blocking region having a refractive index from about 3.7 to 3.

In some embodiments, the VCSEL can be devoid of an oxide aperture. In some aspects, the VCSEL can be devoid of oxidation.

In some embodiments, the VCSEL can be devoid of a mesa having the isolation region. In some aspects, the VCSEL can include a conductive wing layer integrated with tops of the one or more conductive channel cores. In some aspects, the VCSEL can include a conductive wing layer separate and in contact with tops of the one or more conductive channel cores. In some aspects, the VCSEL can include a blocking layer being InGaP. In some aspects, the VCSEL can include a conductive channel core being AlGaAs.

In some embodiments, the VCSEL can include the one or more conductive channel cores being planarized. In some aspects, the VCSEL can include the one or more conductive channel cores and top mirror being planarized.

In some embodiments, the VCSEL can include: the blocking region having a first thickness; and one or more of the conductive channel cores having a second thickness that is larger than a first thickness. In some aspects, the blocking region is defined by having an implant and the one or more conductive channel cores are devoid of the implant. In some aspects, the blocking region is lateral to the one or more conductive channel cores. In some aspects, the blocking region and one or more conductive channel cores are an isolation region. In some aspects, the VCSEL can include a non-planarized semiconductor region of one or more non-planarized semiconductor layers over the isolation region. In some aspects, the implant is silicon. In some aspects, the implant is oxygen. In some aspects, the blocking layer includes a base material of the conducive channel core with the addition of the implant.

In some embodiments, the mirror layers in the non-planarized top mirror have a connected step such that a first non-planarized top mirror layer has a lower region above the blocking region that is connected to a higher region above the conductive channel core.

In some embodiments, the mirror layers in the non-planarized top mirror have a disconnected step such that a first non-planarized top mirror layer has a lower region above the blocking region that is disconnected to a higher region above the conductive channel core.

In some embodiments, the blocking layer includes a first material that is etched to form a channel and the conductive channel core includes a different second material that is filled into the etched channel.

In some embodiments, the VCSEL can include a plurality of conductive channel cores forming a pattern to result in a single non-fundamental mode. In some aspects, the plurality of conductive channel cores includes two or more conductive channel cores in a pattern for a single non-fundamental mode. In some aspects, the pattern is a Languerre-Gaussian profile. In some aspects, the pattern is a Hermite-Gaussian profile. In some aspects, the pattern is an Ince-Gaussian profile.

In some embodiments, the plurality of conductive channel cores operate as a single emitter. In some aspects, the electrical current between the top electrical contact and bottom electrical contact is passed through each of the plurality of conductive channel cores in the pattern. In some aspects, each conductive channel core in the pattern has the same dimensions and shape. In some aspects, each conductive channel of the pattern is part of a single optical field. In some aspects, the pattern is optimized to reduce sensitivity to optical feedback. In some aspects, the pattern is arranged to provide gain at the locations of the plurality of conductive channel cores. In some aspects, the pattern defines a preferred mode.

In some embodiments, a VCSEL includes a waveguide between adjacent conductive channels. In some aspects, the waveguide extends through the first isolation region and second isolation region between the first laser emitter and second laser emitter or photodetector or modulator. In some aspects, the waveguide extends through a region above the first isolation region and second isolation region between the first laser emitter and second laser emitter or photodetector or modulator. In some aspects, the waveguide extends through a region below the first isolation region and second isolation region between the first laser emitter and second laser emitter or photodetector or modulator. In some aspects, the waveguide has a rectangular-shaped profile. In some aspects, the waveguide has a bowtie-shaped profile. In some aspects, the waveguide has a diamond-shaped profile.

In some embodiments, operation of the VCSEL locks a first laser emitter and a second laser emitter with a same color. In some aspects, light is passed through the waveguide between the first laser emitter and second laser emitter. In some aspects, light is passed through the waveguide between the first laser emitter and second laser emitter and light is emitted from both the first laser emitter and second laser emitter.

In some embodiments, light is passed through the waveguide between the first laser emitter and a monitor and emitted from the first laser emitter.

In some embodiments, light is passed through the waveguide between the first laser emitter and modulator and emitted from the modulator. In some aspects, the first laser emitter comprises an opaque member that blocks light from being emitted therefrom so that the light passes through the waveguide for modulation and emission from the modulator.

In some embodiments, an array of the VCSELs includes a plurality of the VCSELs of one or more of the embodiments in a device. The VCSELs of the array can be electrically coupled together and operate together. The VCSELs of the array can be electrically uncoupled and operate separately.

In some embodiments, methods of manufacturing can provide the embodiments of VCSELs described herein.

In some embodiments, methods of operating the embodiments of VCSELs described herein can emit light.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 4A includes a cross-sectional side view of a plurality of VCSELs.

FIG. 4B includes a cross-sectional side view of a plurality of VCSELs having a plurality of light emitting conductive regions.

FIG. 5B includes a cross-sectional side view of two optically coupled light emitting conductive regions of a VCSEL.

FIG. 5C includes a cross-sectional side view of two optically coupled light emitting conductive regions of a VCSEL.

Figure 1A:
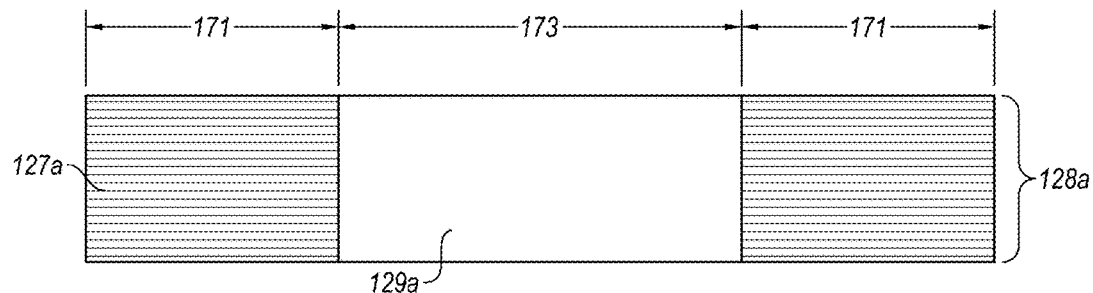
FIGS. 1A-1E include cross-sectional side views that show different embodiments of isolation regions of VCSELs having a conductive region and a blocking region.

The elements of the figures are arranged in accordance with at least one of the embodiments described herein, and which arrangement may be modified in accordance with the disclosure provided herein by one of ordinary skill in the art. The different embodiments of the different figures may be included with other embodiments of other figures. Various elements of one of the figures can be used with compatible embodiments of other figures. The elements of the figures are not drawn to scale.

DETAILED DESCRIPTION

In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present advancement in VCSEL technology relates to an insulation region having a blocking region and a conductive region formed by various processing protocols, which result in different structures that include a blocking region and conductive region above and/or below the active region. As such, the cross-section of the VCSEL can include the isolation region above or below the active region. The isolation region usually has the conductive region extending from a base of the isolation region to a top of the isolation region with the blocking region laterally of and surrounding the conductive region.

In one embodiment, the blocking region may also extend from the base of the isolation region to the top of the isolation region and have the same height (e.g., thickness) as the conductive region. FIG. 1A shows such an isolation region 128a having the blocking region 127a and the conductive region 129a extending from the bottom to the top.

FIG. 1A also shows the outer current blocking regions 171 and central mode confinement region 173.

Figure 1B:
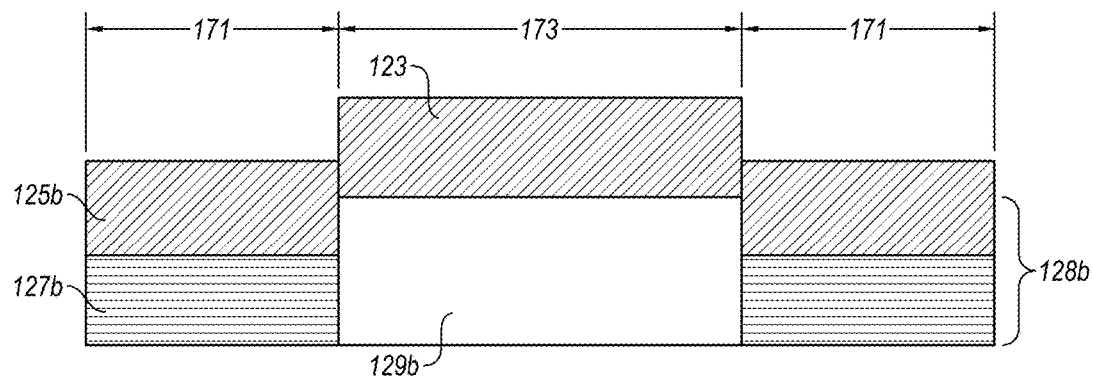

FIG. 1B shows another embodiment, where the blocking region 127b may extend from the base of the isolation region 128b to a region between the base and top of the isolation region 128b such that the blocking region 127b is shorter (e.g., has less height or thickness) than the conductive region 129b, where another region (e.g., mirror or spacer region) may extend from the blocking region 127b to the top of the isolation region 128b and laterally surround the conductive region 129*b*, where the blocking region 127*b* is absent. FIG. 1B shows the isolation region 128*b* having the conductive region 129*b* extending from the bottom to the top with a shorter blocking region 127*b* and another region 125*b* above the shorter blocking region 127*b*. Here, there is a step between the top of the another region 125*b* and the top of the conductive region 129*b*, such that the upper region 123 (e.g., layers, such as being the same or different from the another region 125*b*) formed over the isolation region 128*b* are stepped or not planarized. The another region 125*b* may be continuous over the blocking region 127*b* and conductive region 129*b* (see FIG. 1C), or segmented over these regions as shown in FIG. 1B. Also, it should be noted that the mirror regions and/or any other region over the isolation region 128*b* are stepped or not planarized.

Figure 1C:
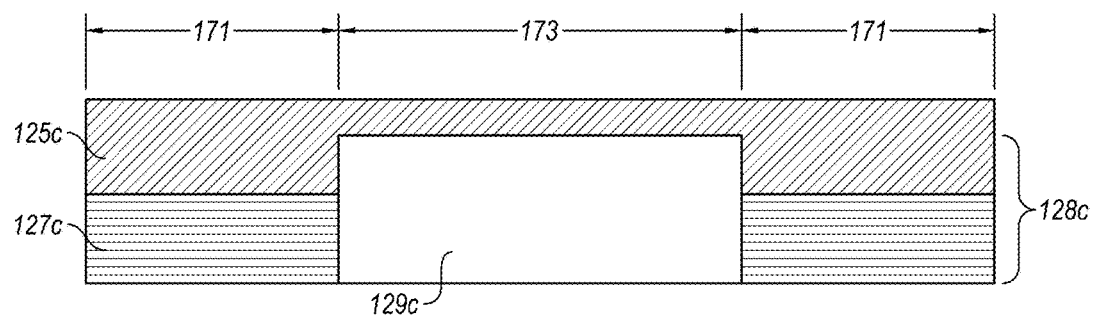

FIG. 1C shows an isolation region 128*c* with the another region 125*c* extending over the blocking region 127*c* and also extending over the conductive region 129*c* so that the layers formed thereover are planarized and not stepped. Also, it should be noted that the mirror regions and/or any other region over the isolation region 128*c* are planarized and without steps. FIG. 1C shows that a blocking region 127*c* may extend from the bottom of the isolation region 128*c* to a region between the base and top of the isolation region 128*c* such that the blocking region 127*c* is shorter (e.g., has less height or thickness) than the conductive region 129*c*, where the another region 125*c* (e.g., mirror or spacer region) may extend from the blocking region 127*c* to the top of the isolation region 128*c* and laterally surround the conductive region 129*c* where the blocking region 127*c* is absent.

Figure 1D:
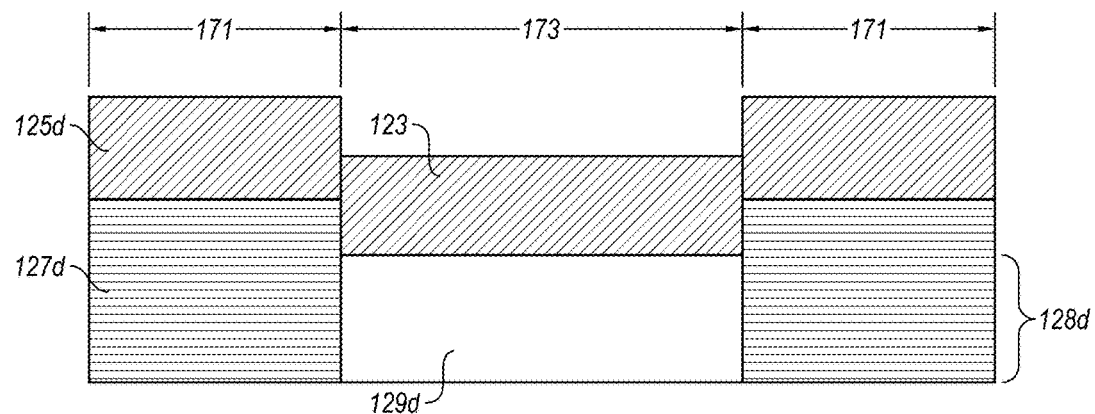

FIG. 1D shows an isolation region 128*d* having the blocking region 127*d* extending from the bottom to the top of the isolation region 128*d* with a shorter conductive region 129*d* and another region 125*d* above the blocking region 127*d* with an upper region 123 above the shorter conductive region 129*d*. Here, there is a step between the top of the another region 125*d* and the top of the blocking region 127*d* such that the layers formed over the isolation region 128*d* are stepped or not planarized. The another region 125*d* may be continuous with the upper region 123 over the blocking region 127*d* and conductive region 129*d*, or segmented from the upper region 123 over the blocking region 127*d* and conductive region 129*d* as shown. Also, it should be noted that the mirror regions and/or any other region over the isolation region 128*d* are stepped or not planarized.

Figure 1E:
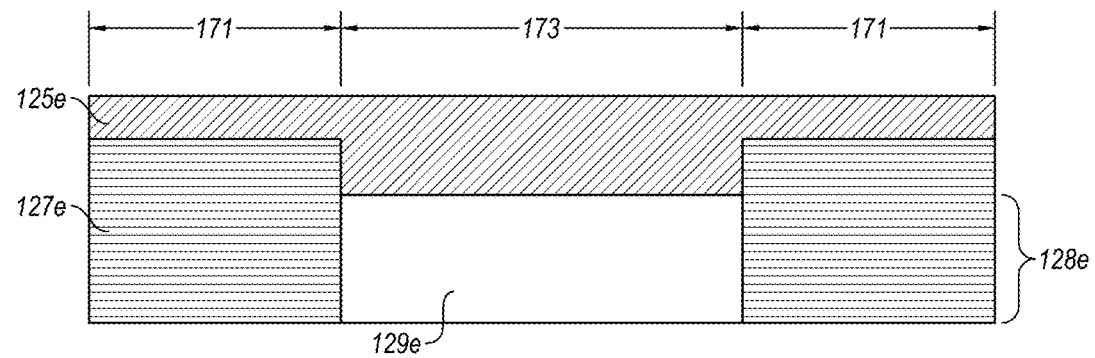

FIG. 1E shows an isolation region 128*e* with the another region 125*e* extending over the blocking region 127*e* and also extending over the conductive region 129*e* so that the layers formed thereover are planarized and not stepped. Also, it should be noted that the mirror regions and/or any other region over the isolation region 128*e* are planarized and without steps.

The configurations of the isolation regions shown in FIGS. 1A-1E are described to be capable of being above or below an active region (e.g., light emitting region), so as to be between the active region and light emitting surface or between the active region and substrate. Also, the orientation of the isolation regions can be switched so that either side is up or down, where the orientation illustrated in FIGS. 1A-1E can be flipped so that the end shown as the top can be on the bottom with respect to the substrate. As such, either surface can be oriented toward the light emitting surface of the VCSEL, oriented toward the active region, or oriented toward the substrate. As such, the regions or layers above the isolation region can be planarized or non-planarized depending on the configuration of the isolation region. Similarly, the regions below the isolation can be planarized or non-planarized in order to arrive at the embodiments that are flipped compared to as illustrated in FIGS. 1A-1E.

In one embodiment, the planarized embodiments can be prepared by forming the blocking region and etching a central region of the blocking region and depositing a conductive region therein. The conductive region can include a material that is more electrically conductive than the material of the blocking region during operation of the VCSEL and light emission in an active region. Accordingly, the blocking region and conductive region can form a heterojunction for selective current guidance. The conductive region can form a conductive channel through the blocking region. The conductive region may be planarized by forming a portion over the blocking region. Planarized layers can be formed over the conductive region. Otherwise, the VCSEL can be prepared as standard in the industry or as in the incorporated references. Alternatively, the conductive region can be formed and etched before the blocking region is deposited in the etched regions. In any event, the top surface can be planarized for planarized (e.g., planar) regions formed thereover.

In one embodiment, the blocking region and conductive region can be formed by preparing a conductive layer that is protected in regions during implantation so that the protected region forms the conductive region and the implanted region forms the blocking region around the conductive region. Either the blocking region or the conductive region can be etched as described herein or as known in the art so that either the conductive region or blocking region is shorter than the other. Mirror layers are then formed above in a non-planarizing format that results in stepped mirror periods. The conductive region can include a material that is more electrically conductive than the material of the implanted material of the blocking region during operation of the VCSEL and light emission in an active region. Accordingly, the blocking region and conductive region can form a heterojunction for selective current guidance. The conductive region can form a conductive channel through the blocking region. Otherwise, the VCSEL can be prepared as standard in the industry or as in the incorporated references. In any event, the top surface can be stepped or not planarized for stepped or non-planarized (e.g., not planar) regions formed thereover.

In one embodiment, after etching the blocking region or conductive region another layer can be deposited thereover to form a planarized surface for planarized (e.g., planar) regions formed thereover (FIGS. 1C and 1E).

The semiconductor devices of the present invention can be manufactured from any type of semiconductor. Examples of suitable materials include III-V semiconductor materials (e.g., prepared from one or more Group III materials (boron (B), aluminium (Al), gallium (Ga), indium (In), thallium (Tl), and ununtrium (Uut)) and one or more Group V materials (nitrogen (N), phosphorus (P), arsenic (As), antimony (Sb), bismuth (Bi) and ununpentium (Uup) (unconfirmed)) and optionally some type IV materials.

The semiconductor device can include an active region having one or more quantum wells and one or more quantum well barriers. The quantum wells and quantum well barriers can be separated by one or more transitional layers therebetween. The transitional layers may also be referred to as interfacial layers as they are located at the interface between the quantum wells and quantum well barriers. However, the active region can be configured as any known or developed in the art of VCSELs.

Optionally, electrical confining layers can sandwich the active region and provide optical gain efficiency by confining carriers to the active region. The confining layers can have a region of high energy band gap which in the case of many III-V compounds translates to high aluminum content (e.g., 70%-100% Al for the type III material). The aluminum content can be selected to give the material a relatively wide band gap, as compared to the band gap in the quantum well barriers of the active region. The wide band gap material can give the confining layer good carrier confinement and increases the efficiency in the active region. In an exemplary embodiment, the high aluminum region may also include an increase in doping. The confining layer can be doped with a p-type or n-type dopant depending on whether the confinement barrier is on the n-side or p-side of the active region.

The heterojunction conductive channel configuration can provide improved fiber optic transceiver reliability, electro-optical bandwidth, and link distances by allowing implementation of small aperture (e.g., 2-6 μm) VCSEL devices. In high power VCSELs, the heterojunction conductive channel configuration allows higher maximum power per VCSEL, and more emitters per unit area in dense arrays.

This heterojunction conductive channel configuration enables more efficient mass production of guided mode VCSELs by allowing use of one or more MOCVD (metal-organic chemical vapor deposition) crystal growth steps in fabrication. As such, the process can omit lateral steam oxidization, or formation of any oxide aperture.

Figure 2:
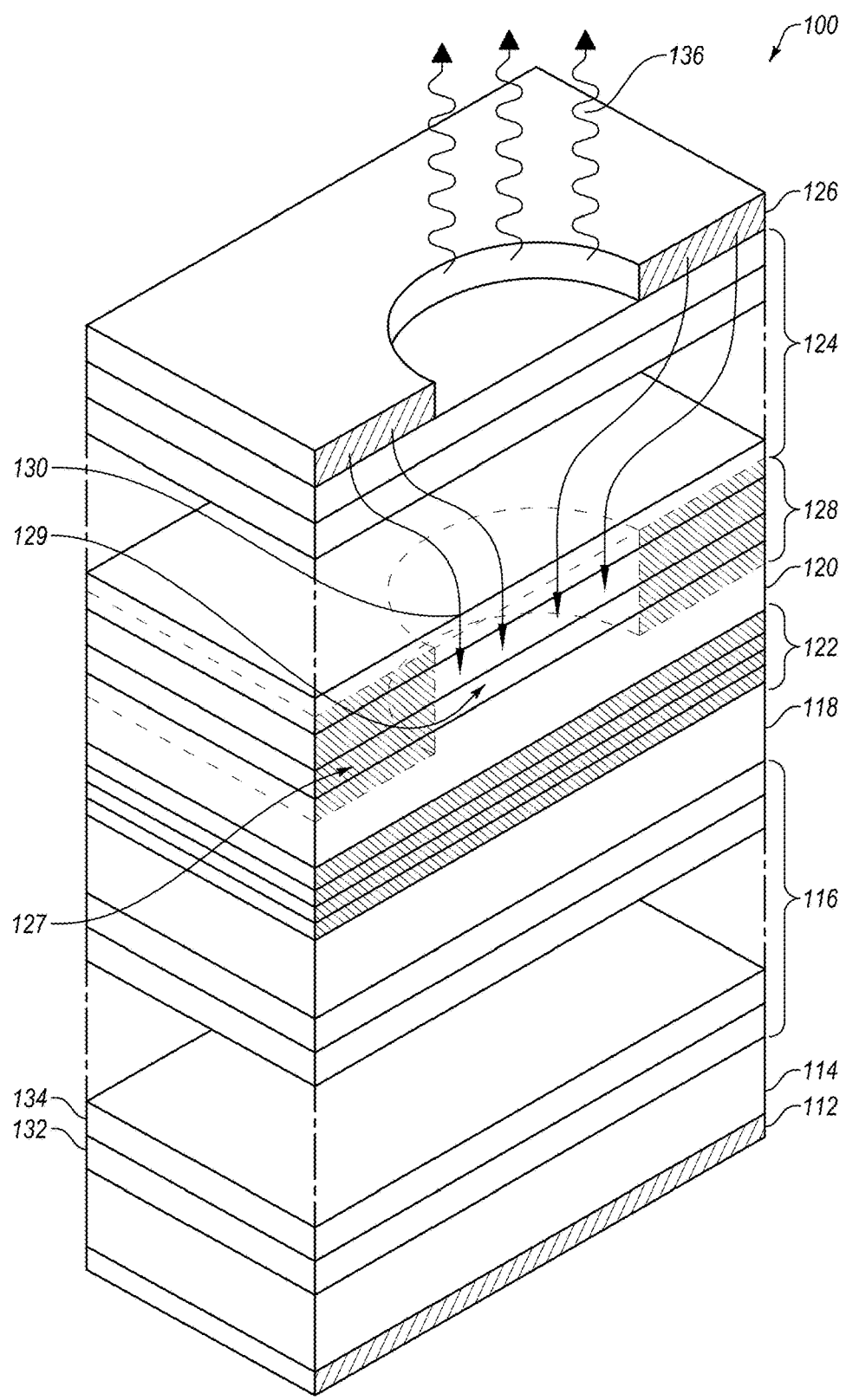
FIG. 2 includes a perspective view of an embodiment of a VCSEL.

FIG. 2 shows a planar, current-guided, VCSEL 100 having periodic layer pairs for top (124) and bottom (116) mirrors that can include any embodiment of an isolation region 128 as described herein. While the isolation region 128 and upper mirror stack 124 are shown to be planar, they can be configured to be non-planar or stepped as described herein. A substrate 114 is formed on a bottom metal contact layer 112 and is doped with a first type of impurities (i.e., p-type or n-type dopant). A bottom mirror stack 116 is formed on substrate 114 and an optional bottom confining layer 118 is formed on bottom mirror stack 116. An active region 122 is formed over the bottom mirror stack 116, or over the bottom confining layer 118 (when present). An optional top confining layer 120 is formed over the active region 122. In one optional aspect, the bottom confining layer 118 and a top confining layer 120 sandwich the active region 122. The isolation region 128 is formed over the active region 122 or over the optional top confining layer 120. The isolation region 128 includes a lateral region blocking region 127 and a central conductive channel region 129. The bottom confining layer 118 and/or top confining layer 120 may be a spacer region between the active region 122 and isolation region 128. Alternatively, the bottom confining layer 118 and/or top confining layer 120 may be a conductive region. Thus, any spacer region bounding the active region may be a confining region, conductive region, or semiconductor spacer that is not confining or conducting.

An upper mirror stack 124 is formed over the isolation region 128. A top metal contact layer 126 forms a contact on a portion of upper mirror stack 124. However, other VCSEL configurations may also be utilized, and various other VCSEL layers or types of layers can be used.

The isolation region 128 restricts the area of the current flow 130 through the active region 122. Isolation region 128 can be formed to include the lateral region blocking region 127 and a central conductive channel region 129 as planarized or stepped (e.g., non-planar). The isolation region 128 can include a single layer lateral region blocking region 127 or multiple layers of blocking layers, and/or a single layer central conductive channel region 129 or multiple layers of central conductive channel region layers.

Mirror stacks 116 (bottom) and 124 (top) can be distributed Bragg reflector (DBR) stacks, and include periodic layers (e.g., 132 and 134). Periodic layers 132 and 134 are typically AlGaAs and AlAs, respectively, but can be made from other III-V semiconductor materials. Mirror stacks 116 and 124 can be doped or undoped and the doping can be n-type or p-type depending on the particular VCSEL design. However, other types of VCSEL mirrors may be used.

Metal contact layers 112 and 126 can be ohmic contacts that allow appropriate electrical biasing of VCSEL 100. When VCSEL 100 is forward biased with a voltage on contact 126 different than the one on contact 112, active region 122 emits light 136, which passes through upper mirror stack 124. Those skilled in the art will recognize that other configurations of contacts can be used to generate a voltage across active region 122 and generate light 136.

As described herein, the embodiment of FIG. 2 can be duplicated in a common device so that there are a plurality of conductive channel regions with a common blocking region. This allows the operation thereof to pass a common electrical current between the contact layers 112 and 126 for unified operation. This results in the plurality of conductive channel regions forming a common optical emitter that emits the same light.

Figure 2A:
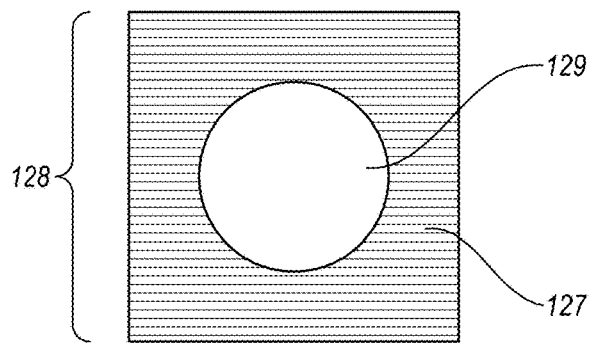
FIG. 2A includes an overhead view of a VCSEL.
Figure 2B:
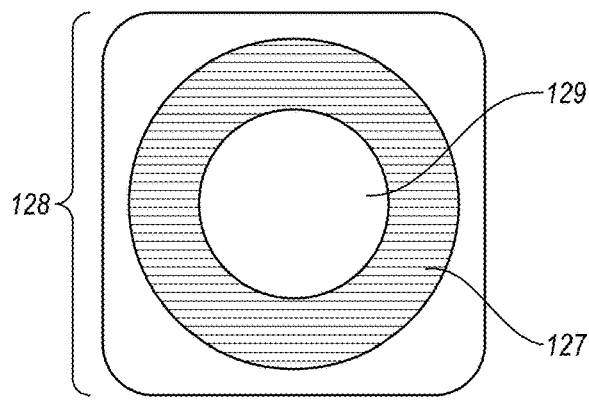
FIG. 2B includes an overhead view of a VCSEL with a mesa.

FIG. 2A shows a top view with a squared cross-section of an isolation region. FIG. 2B shows a top view with a circular cross-section of an isolation region with etching to form a mesa. A single chip may have a plurality of the isolation regions either planar as in FIG. 2A or etched to have a plurality of mesas on a single chip. Each isolation region 128 has the conductive regions for laser emission. These separate conductive regions 129 can be operated separately for separate laser beam emissions. As such, a plurality of beams may be emitted from the plurality of conductive regions 129, where each conductive region 129 can be controlled separately or controlled together or some group may be controlled together while other groups may be controlled separately.

Figure 3:
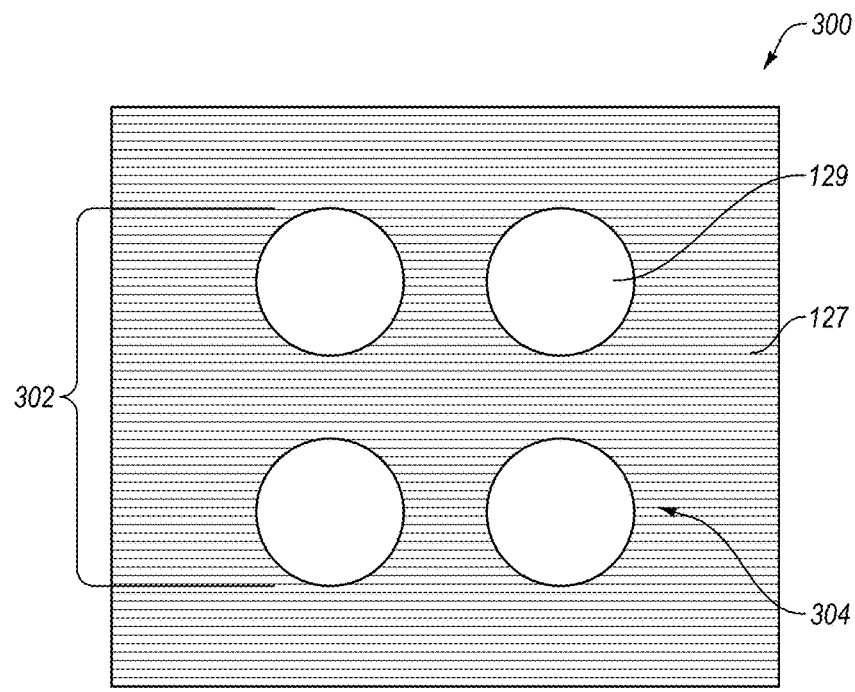
FIG. 3 includes an overhead view of a VCSEL having a plurality of light emitting conductive regions.

FIG. 3 shows an example of a preferred mode configuration 300. The preferred mode configuration has the blocking region 127 and a plurality of conductive regions 129. While four conductive regions are shown, any reasonable number of conductive regions can be included. While the four conductive regions are arranged in a square orientation, the conductive regions can be arranged in any orientation and in any pattern. While the four conductive regions are shown to have the same dimensions (e.g., same diameter), the conductive regions may have different dimensions (e.g., different diameters). While circular conductive regions are shown, the conductive regions can be of any shape including ovals and polygons.

The preferred mode configuration 300 can be arranged so that the light emitted therefrom is in a preferred mode by forcing current through the conductive regions 129 into specific regions of the active region, which can cause delays and non-fundamental order modes. Here, all of the conductive regions 129 are operated together as a single emitter 302. The conductive regions 129 of the single emitter 302 can be spaced closely together, such as about 5 microns apart center to center or a total spacing of 5 microns from one edge to the opposite edge. Other center to center spacing (or one edge to the opposite edge spacing) can be used such as 6, 7, 8, 9, 10, 11, 12, 13, 14, 15, 16, 17, 18, 19, or 20 microns; however, smaller spacing is preferred (e.g., less than 10 microns or less than 6 microns). As noted, the plurality of conductive regions 129 of the single emitter 302 are in close proximity so as to operate together as a single emitter and the spacing and arrangement of the conductive regions allows for operation in a non-fundamental mode (e.g., single non-fundamental mode). Accordingly, the conductive regions 129 of the single emitter 302 form one optical field.

The preferred mode configuration 300 may be very advantageous for optimizing laser insensitivity to feedback (e.g., lowered relative intensity noise) and can be used for optimizing coupling to selective fiber modes to optimize fiber modal bandwidth. FIG. 3 shows one geometry, however, the preferred mode configuration 300 can have conductive region 129 patterning of any of the classic laser modes such as Laguerre-Gaussian profiles or Hermite-Gaussian profiles.

The preferred mode configuration 300 allows for the selective pattern and spatial arrangement to utilize the Languerre-Gaussian modes or Hermite-Gaussian modes of a waveguide. The conductive regions 129 can be arranged so as to provide gain at the points of the Languerre Gaussian modes or Hermite-Gaussian modes to induce those mode delays, and not induce fundamental modes. This provides the non-fundamental mode for the preferred mode configuration 300. The index steps (e.g., interface) for the conductive regions 129 relative to the blocking regions 127 (e.g., interface between conductive region 129 and blocking region 127) can be located at the points of the Languerre Gaussian modes (or Hermite-Gaussian modes) so that only those modes form. This allows the modes to be a super set of the modes of the conductive regions 129 so that the laser mode goes into all of the conductive regions 129 of the preferred mode configuration 300. The result is a sharing of the optical field amongst the conductive regions 129 of a preferred mode configuration 300. Also, Ince-Gaussian modes or others can be used.

The preferred mode configuration 300 allows for the laser, including one emitter conductive region 129 or a plurality of emitter conductive regions 129 (e.g., each conductive region 129 emitting a unique light beam from the active region) to be in a particular mode for passing into an optical fiber so as to control the bandwidth of the optical fiber by only passing specific modes. The plurality of conductive regions 129 can be adapted to provide light input into a common optical fiber. As such, a particular mode profile is achieved that can be matched directly to a low profile and an optical fiber, which allows suppression of all of the other modes resulting in a single mode (e.g., one color for one mode).

The use of the preferred mode configuration 300 can be achieved by a predetermined conductive region pattern 304 with defined locations, shapes, and sizes for each conductive region 129 so that they share one optical mode. Light is emitted through the surface of the VCSEL in relationship to each conductive region 129 (e.g., one light beam per conductive region 129), whereby the light passes through each conductive region 129 or along a vertical axis thereof (e.g., defined by the light emitting orientation from the surface of the VCSEL being a vertical axis).

Previously, conductive regions 129 were spaced apart and operated separately as an array of emitters with separate optical fields. Now, a plurality of conductive regions 129 can be operated together to form the plurality of light beams in a common optical field for use as a combined beam or combined array of light having substantially the same properties.

FIG. 4A shows an example of an array of emitters (e.g., emitter array 400) with separate optical fields associated with the conductive regions 129, each conductive region being a different emitter and thereby operated independently from each other. While only one Gaussian type shape is shown for each conductive region 129, there can be up to ten modes or more with each conductive region 129 having its own electrical field. In FIG. 4A, the dimension D1 is about 10 to 40 microns, and the dimension D2 is about 5 to 20 microns.

Now, however, the conductive regions 129 of a preferred mode configuration 300 can be operated as a single emitter with a single optical field for a single optical mode, as shown in FIG. 4B. It is noted that the dimensions in the preferred mode configuration 300 are significantly smaller than compared to the emitter array of FIG. 4A. The conductive region pattern 304 defines the single particular mode for the cavity. This provides for a narrower wavelength range from the emitter 302. The single electric field for the preferred mode configuration 300 occupies each of the conductive regions 129 so that the result is a single mode. In FIG. 4B, the dimension D3 is about 1 to 2 microns, and the dimension D4 is about 0.5 to 0.75 microns, and D5 is about 5 microns to about 8 microns.

Figure 4C:
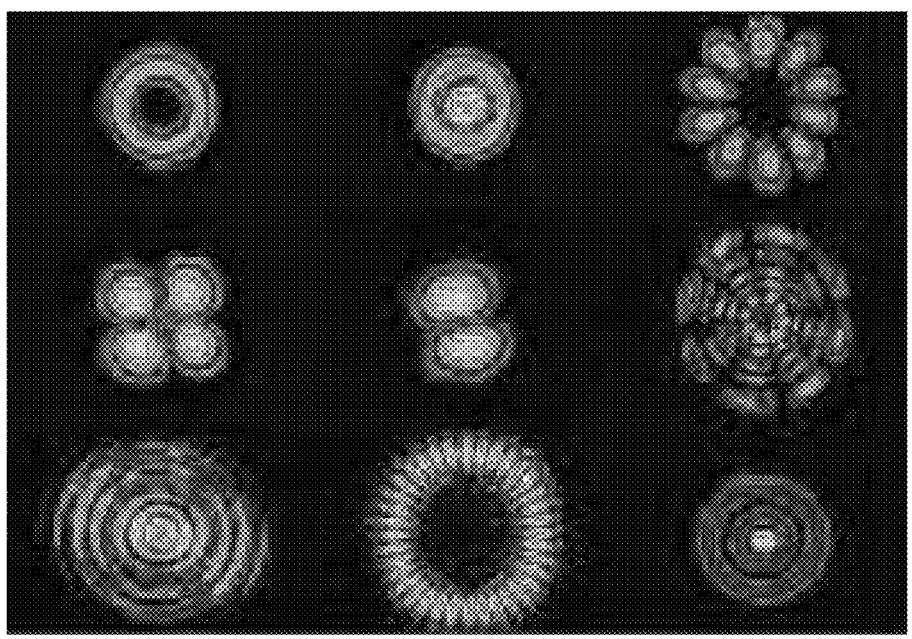
FIG. 4C includes an overhead view of a schematic representation of shapes and patterns for conductive regions of a VCSEL having one or a plurality of light emitting conductive regions for Laguerre-Gaussian patterns.

FIG. 4C shows Laguerre-Gaussian profiles. As such, the conductive regions and blocking regions can be prepared to have shapes as shown in FIG. 4C and dimensioned appropriately. This results in the optical presentation as shown. In one aspect, the conductive regions can be the highlighted regions and the blocking regions can be the dark regions. The different modes match the conductive regions, to get the ¼ mode (center left), ½ mode (center middle), 1/12 mode (top right), or other 1/N mode with N being the appropriate integer. Each one of these pattern profiles can be included in the laser structure itself as the conductive regions, and then the laser lases in exactly that mode. While, for example, the middle right shows oblong shapes the actual conductive region can be circular.

In one aspect, there is a radial function and an angular function, and the angular function repeats in integral numbers of Pi.

Figure 4D:
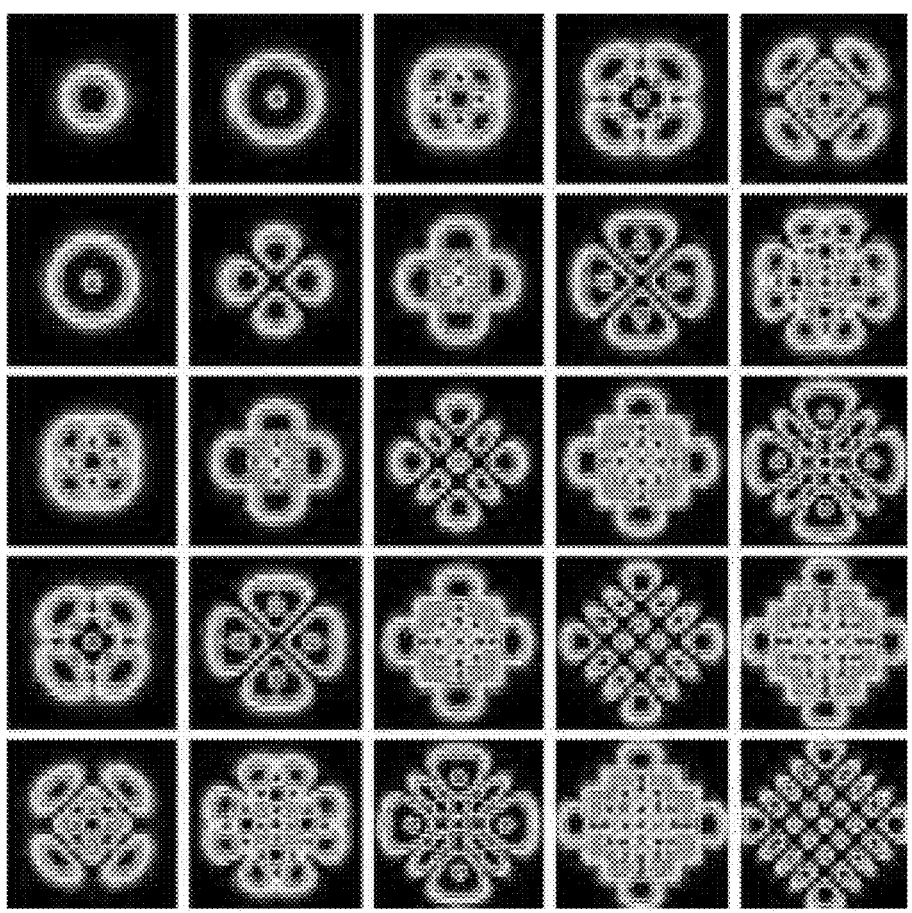
FIG. 4D includes an overhead view of a schematic representation of shapes and patterns for conductive regions of a VCSEL having one or a plurality of light emitting conductive regions for Hermite-Gaussian patterns.

FIG. 4D shows the Hermite-Gaussian modes that can be used for patterning the conductive regions in the blocking regions.

Figure 4E:
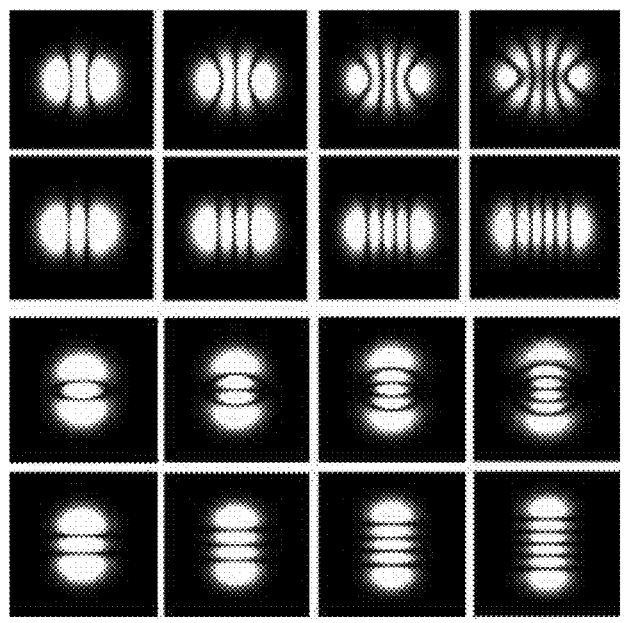
FIG. 4E includes an overhead view of a schematic representation of shapes and patterns for conductive regions of a VCSEL having one or a plurality of light emitting conductive regions for Ince-Gaussian patterns.

FIG. 4E shows the Ince-Gaussian modes that can be used for patterning the conductive regions and the blocking regions.

Additionally, the conductive regions, such as adjacent conductive regions, can be optically linked through a waveguide, which can allow for various types of devices and operations. As such, the waveguide can extend from an optically transmissive portion of a first conductive region to an optically transmissive portion of a second conductive region, third conductive region, and additional conductive regions. With reference to FIG. 2, the waveguide can be optically coupled with the conductive region 129 and burrowed through the blocking region 127 until reaching an additional conductive region 129.

Figure 5A:
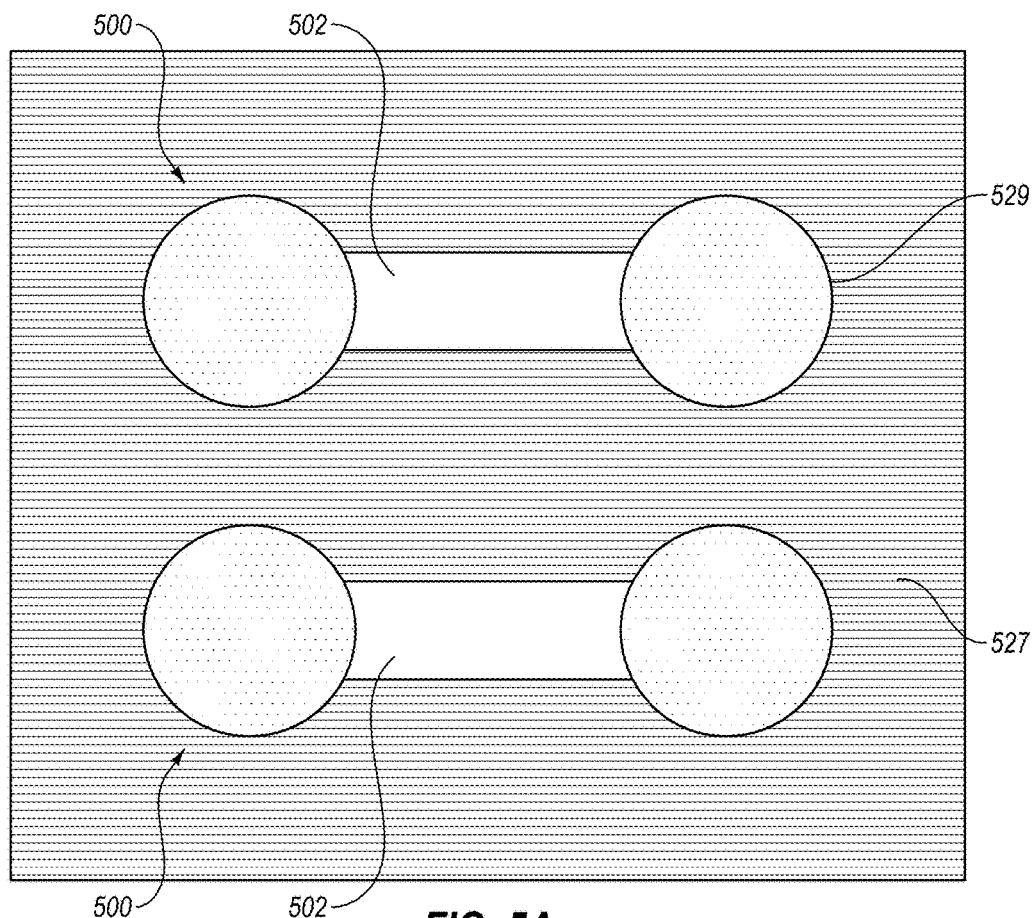
FIG. 5A includes an overhead view of two optically coupled light emitting conductive regions of a VCSEL.
Figure 5D:
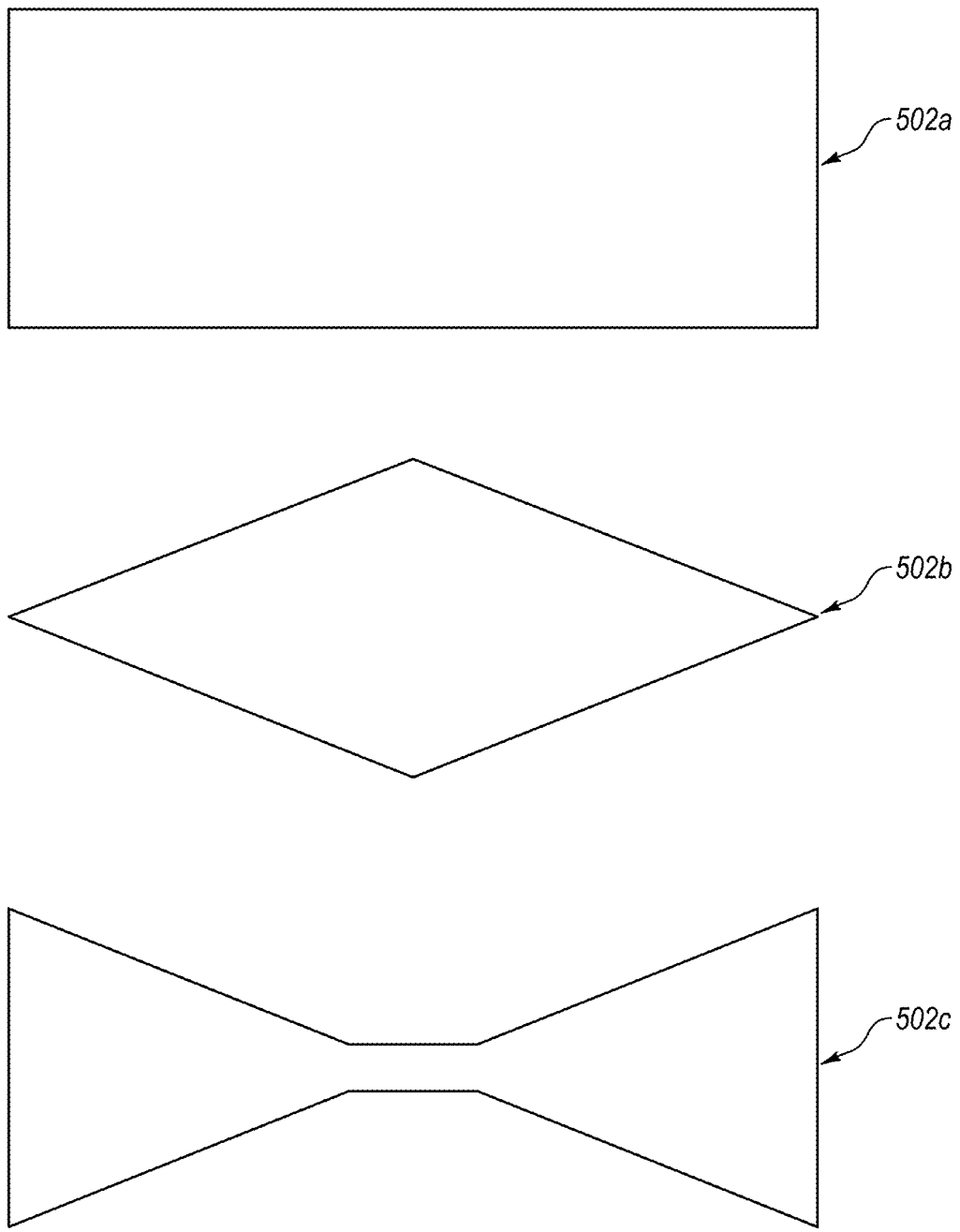
FIG. 5D includes a cross-sectional side view of a waveguide that can optically couple two light emitting conductive regions of a VCSEL.

FIG. 5A shows a coupled laser system 500 having two conductive regions 529 coupled to each other via a waveguide 502 and defined by blocking regions 527 as described herein. The waveguide 502 can be any wave guiding material, such as those known or developed in the art. The thickness or width of the waveguide 502 can be dimensioned as is suitable for a particular use or for a particular amount of light to pass from a first conductive region 529a to a second conductive region 529b. FIG. 5A shows two different coupled laser systems 500; however, a single substrate may have 1 or 2 or a plurality of coupled laser systems 500. FIG. 5B shows a cross-sectional side view of the coupled laser system 500. While shown as a rectangular shape 502a, the waveguide 502 can be any shape such as bowtie 502c or diamond shape 502b (FIG. 5D). While shown to be located at least partially in the blocking region 527, the waveguide 502 can be completely within the blocking region 527, at the top of the blocking region 527, at the bottom of the blocking region 527 as shown, in the mirrors that are above or below the isolation region, or in any other region above or below the isolation region (e.g., see FIG. 2). This allows light to pass from one spatial point to the other spatial point while keeping them phased. FIG. 5C shows another cross-sectional side view where the conductive regions 529a, 529b and blocking regions 527 have the same height so that the layers above can be planarized.

In one embodiment, the coupled laser system 500 allows light to pass from one spatial point (e.g., associated with the first conductive region 529a) to the other spatial point (e.g., associated with the second conductive region 529b) while keeping them phased.

In one embodiment, the coupled laser system 500 is a dual emitter configuration that emits a first light with a first wavelength (e.g., first color) through the first conductive region 529a and a second light with a slightly different second wavelength (e.g., second color slightly different from the first color) through the second conductive region 529b. Here, the waveguide 502 optically connects the conductive regions 529, or laser emitters thereof, so that some amount of light is passed from one conductive region 529 to the other conductive region 529, or between the laser emitters thereof, in a manner that results in resonance. The coupled laser system 500 allows for the two emitters to lock the same color (e.g., same mode). This allows for optical feedback from one of the emitters to the other emitter, which results in a high speed laser emission device.

Figure 6:
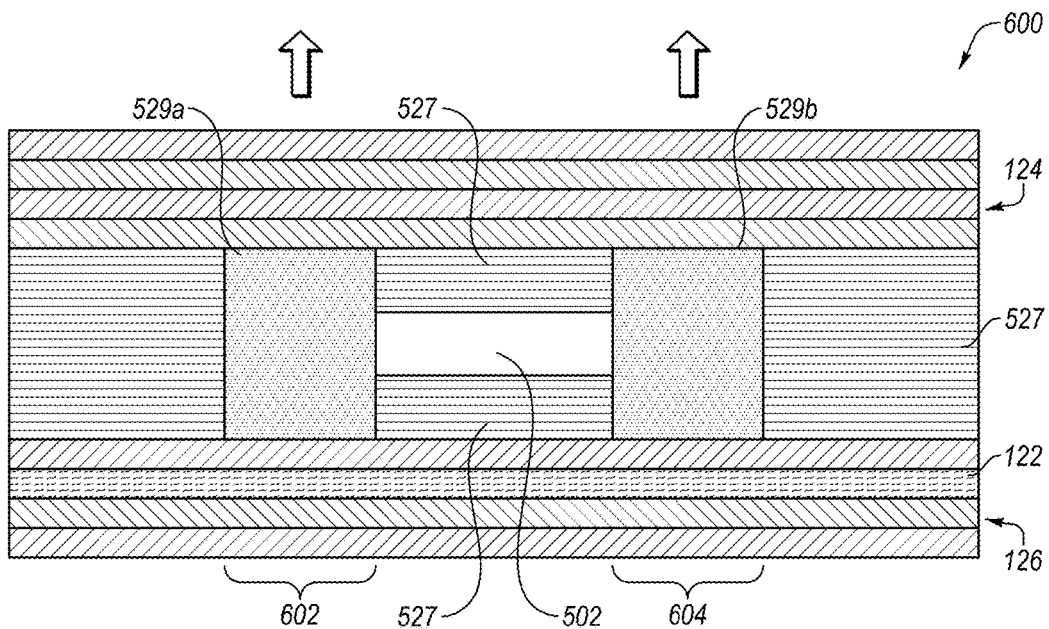
FIG. 6 includes a cross-sectional side view of two optically coupled light emitting conductive regions of a VCSEL.

In one embodiment, the coupled laser system 600 is a dual emitter configuration as shown in FIG. 6 that emits light through the conductive regions 529 from a first laser emitter 602 and a second laser emitter 604. Here, the waveguide 502 optically connects the conductive regions 529a, 529b or laser emitters thereof, so that some amount of light is passed from one conductive region 529a to the other conductive region 529b, or between the laser emitters thereof. The coupled laser system 600 allows for the two emitters to lock the same color (e.g., same mode) for light emission as shown by the arrows. This allows for optical feedback from one of the emitters to the other emitter, which results in a high speed laser emission device. The traditional semiconductor layers, including the active region 122, are also shown.

Figure 7:
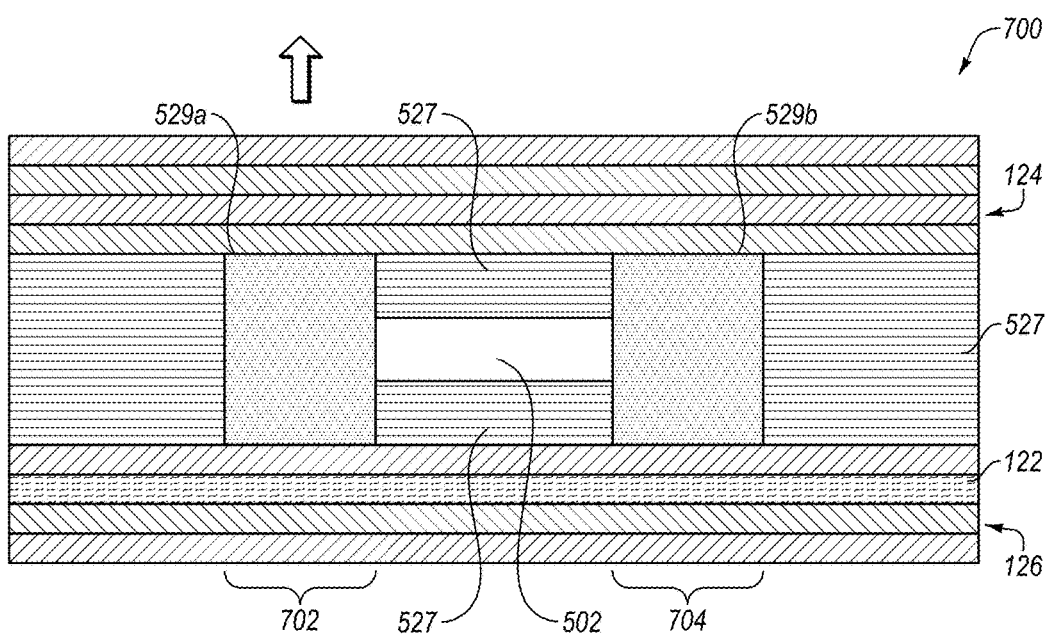
FIG. 7 includes a cross-sectional side view of a light emitting conductive region optically coupled via a waveguide to a photodiode within a VCSEL.
Figure 8:
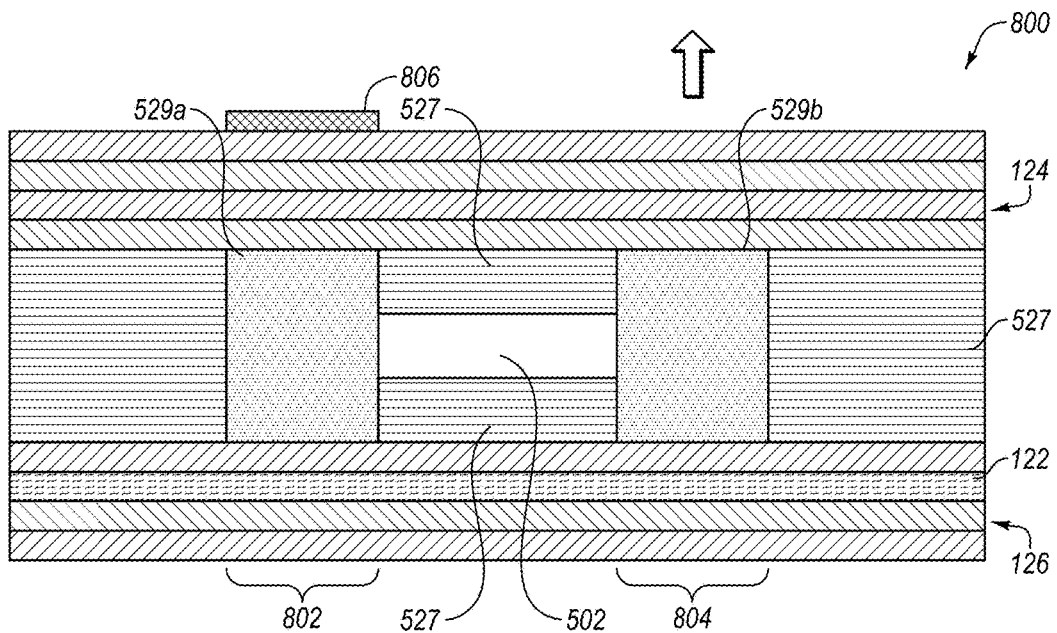
FIG. 8 includes a cross-sectional side view of a light emitting conductive region optically coupled via a waveguide to a modulator within a VCSEL.

In one embodiment, the coupled laser system 700 is an emitter-monitor configuration as shown in FIG. 7 where the first conductive region 529a is associated with a laser emitter structure 702 and the second conductive region 529b is associated with a monitor structure 704 (e.g., reverse biased) that functions like a photodetector. This allows the laser emitter structure 702 to pass light through the waveguide 502 to the monitor structure 704, which allows the monitor to monitor properties of the light. The emitter-monitor configuration can be operated as known or developed in the art. Accordingly, the present technology can include some of the conductive regions in any of the embodiments described herein being monitors to receive and monitor received light. As such, each emitter structure 702 can be optically coupled with one or more monitor structures 704, or a plurality of emitter structures 702, such as those having the same mode, can be optically coupled with a single monitor structure 704.

In one embodiment, the coupled laser system 800 is an emitter-modulator configuration where the first conductive region 529a is associated with a laser emitter structure 802 and the second conductive region 529b is associated with a modulator structure 804. This allows the laser emitter structure 802 to pass light through the waveguide 502 to the modulator structure 804, which allows the modulator structure 804 to modulate data onto the light, which is then emitted as modulated light. Instead of being a vertical emitter-modulator configuration, the coupled laser system 800 provides a lateral emitter-modulator configuration. The emitter-modulator configuration can be operated as known or developed in the art. In one aspect, the laser emitter structure 802 can use a DC current, and the modulator structure 804 can use an AC current to create a modulated signal. The modulated light passes out of the modulator structure 804 as shown with the arrow. In one aspect, the laser emitter structure 802 is blocked in some way (e.g., blocking layer 806, such as a metal cover) so that light does not exit the laser emitter structure 802, but instead passes through the waveguide 502 to the modulator structure 804 so as to be emitted from the modulator structure 804. The modulator structure 804 may be a passive modulator or active electro-optical modulator (e.g., change refractive index and/or absorption).

It should be noted that the lasers, monitor, and modulators are shown generically and the different semiconductor layers, regions, electronics, contacts, drivers, and other well-known components are omitted for clarity. While shown planar, they can be also prepared in mesa or other formats. Also, the coupled laser systems can use the stepped or non-planarized isolation regions and other regions as described herein. The waveguide may be non-conductive.

Figure 9:
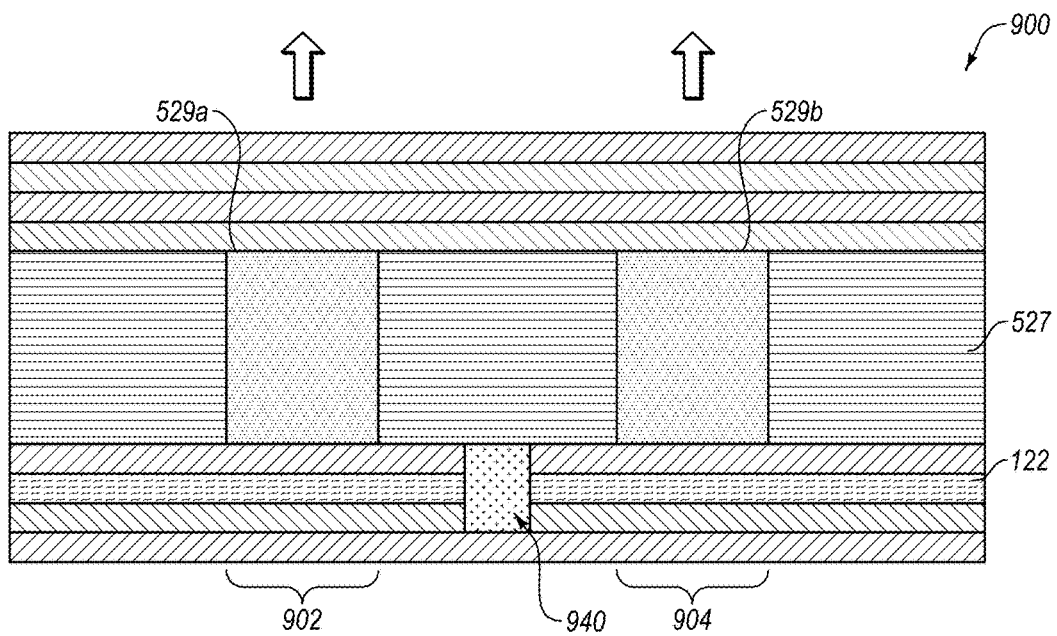
FIG. 9 includes a cross-sectional side view of a first light emitting conductive region separated from a spare light emitting conductive region within a VCSEL.

FIG. 9 shows a redundant system 900 that has two laser emitters 902, 904, each with a conductive region 529a, 529b. This provides for an active laser emitter 902 and a backup laser emitter 904. During normal operation, the active laser emitter 902 emits the light; however, if the active laser emitter 902 is degraded or quits working, the backup laser emitter 904 can then be turned on to emit light. As such, these two laser emitters 902, 904 may be operated independently or operated together with a switch, such as a redundancy switch 940 that turns the backup laser 904 off when active laser emitter 902 is functional, and turns the backup laser 904 on when the active laser emitter 902 is inoperable. While the redundancy switch 940 is shown in the active region 122 between the laser emitter 902 and backup laser 904, the redundancy switch 940 may be an electronic switch that turns the laser emitter 902 and/or backup laser 904 on or off, and the redundancy switch 940 can be an insulator that electrically isolates the active region 122 for the backup laser 904 from the laser emitter 902. Both laser emitters 902, 904 are directed into the same optics so either of them can provide the laser light to the optics (e.g., common optical fiber, lens, etc.). The driver integrated circuit can be the switch from the active laser emitter 902 to the backup laser emitter 904. This configuration can be close together, such as with the separation dimensions of 5, 6, 7, 8, 9, 10, 11, 12, 13, 14, 15, 16, 17, 18, 19, or 20 microns; however, smaller spacing is preferred (e.g., less than 10 microns or less than 6 microns). In operation, the laser emitter 902 may be active at some point, and then become inactive while the backup laser 904 remains inactive. Then, the redundancy switch 940 is switched so that the backup laser 904 becomes active.

Figure 10:
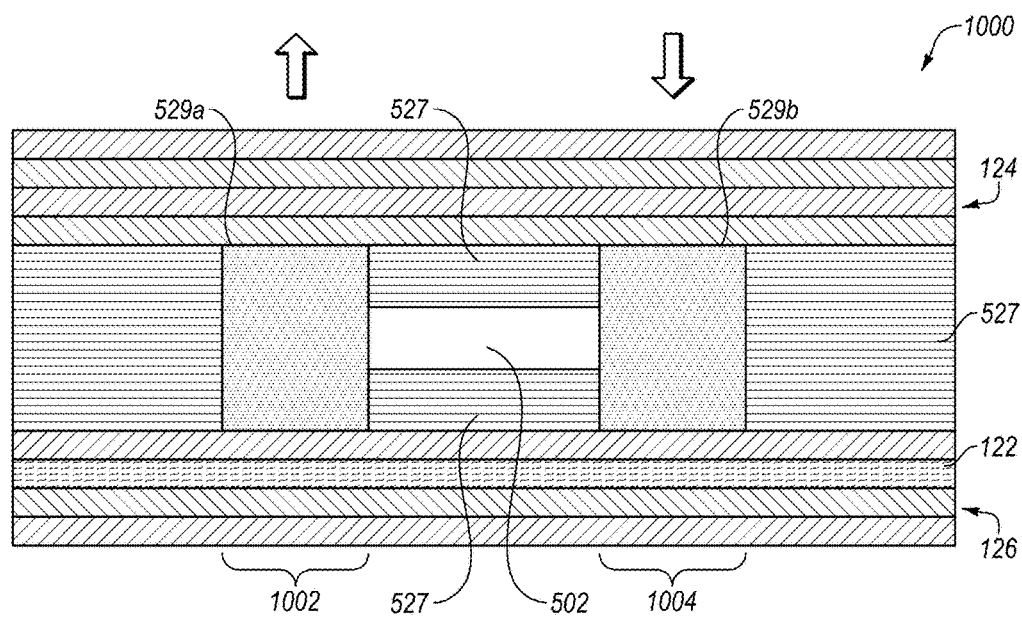
FIG. 10 includes a cross-sectional side view of a light emitting conductive region that is not optically coupled a photodiode within a VCSEL.

In one embodiment, a dual laser and emitter system 1000 is an emitter-monitor configuration as shown in FIG. 10 where the first conductive region 529a is associated with a laser emitter structure 1002 and the second conductive region 529b is associated with a monitor structure 1004 (e.g., reverse biased) that functions like a photodetector. In this embodiment the waveguide 502 is omitted, which allows the monitor structure 1004 to monitor properties of light emitted from a different laser emitter (e.g., not 1002). This allows a single structure to include both a light emitter and a light detector, which can be adjacent to each other, and thereby a plurality of light emitters and light detectors can be arranged in patterns. For example, the patterns shown in FIGS. 3, 4C, 4D, 4E, may include the laser emitter structure 1002 and monitor structure 1004 combination for each location that a laser emitter or unique conductive region is shown. That is, each conductive region may be split into two adjacent conductive regions: one being a laser emitter and the other being a photodetector. Alternatively, the photodetector conductive regions 529b can be in any arrangement or pattern relative to the first conductive regions 529a. The dual emitter and monitor configuration can be operated as known or developed in the art. Accordingly, the present technology can include some of the conductive regions in any of the embodiments described herein being monitors to receive and monitor received light from a different light emitter. As such, each emitter structure 1002 can be paired with one or more monitor structures 1004, or a plurality of emitter structures 1002, such as those having the same mode, can be paired with a single monitor structure 1004, or a plurality of monitor structures can be paired with a single emitter structure 1002.

Figure 11:
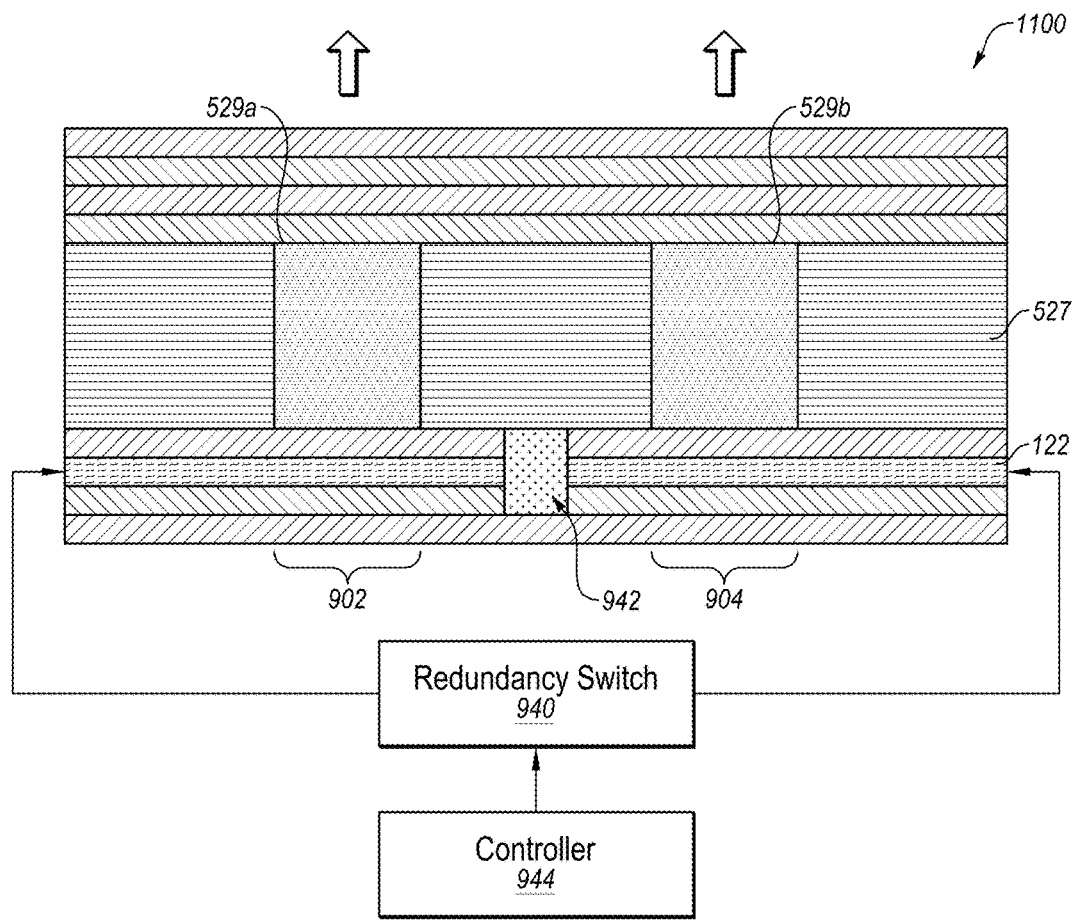
FIG. 11 includes a cross-sectional side view of a first light emitting conductive region separated from a spare light emitting conductive region within a VCSEL with a redundancy switch.

FIG. 11 shows a redundant system 1100 that has two laser emitters 902, 904, each with a conductive region 529a, 529b. This provides for an active laser emitter 902 and a backup laser emitter 904. During normal operation, the active laser emitter 902 emits the light; however, if the active laser emitter 902 is degraded or quits working, the backup laser emitter 904 can then be turned on to emit light. These two laser emitters 902, 904, or at least the active regions 122 of the two laser emitters 902, 904 may be separated by an insulator 942 so that only one of the two laser emitters 902, 904 emits light at a time. As such, these two laser emitters 902, 904 may be operated independently or operated together with a switch, such as a redundancy switch 940 that turns the backup laser 904 off when active laser emitter 902 is functional, and turns the backup laser 904 on when the active laser emitter 902 is inoperable. A controller 944, such as a microprocessor or other computer or computer component, can control the redundancy switch 940 in order to switch from laser emitter 902 to laser emitter 904, or vice versa. The redundancy switch 940 may be an electronic switch that turns the laser emitter 902 and/or backup laser 904 on or off, and the insulator 942 can electrically isolate the active region 122 for the backup laser 904 from the active region for the laser emitter 902. Both laser emitters 902, 904 are directed into the same optics so either of them can provide the laser light to the optics (e.g., common optical fiber, lens, etc.). The driver integrated circuit can be the redundancy switch 940 from the active laser emitter 902 to the backup laser emitter 904. This configuration can be close together, such as with the separation dimensions of 5, 6, 7, 8, 9, 10, 11, 12, 13, 14, 15, 16, 17, 18, 19, or 20 microns; however, smaller spacing is preferred (e.g., less than 10 microns or less than 6 microns). In operation, the laser emitter 902 may be active at some point, and then become inactive while the backup laser 904 remains inactive. Then, the redundancy switch 940 is switched so that the backup laser 904 becomes active.

The VCSEL heterojunction conductive channel configuration can be formed to include a heterojunction current blocking region, with a conductive channel formed by etching an aperture in the blocking region, and a higher refractive index conductive channel core being deposited in the etched aperture. The blocking region can be a lower refractive index perimeter. The refractive index of the blocking region being lower can be comparative to the higher refractive index of the conductive channel core. This allows formation of guided optical modes. Now with the heterojunction conductive channel configuration, a VCSEL or VCSEL array can be more readily fabricated using standard MOCVD technology and other standard fabrication techniques that are currently employed in high volume VCSEL manufacturing.

In one embodiment, a method of manufacture of the VCSEL with the heterojunction conductive channel configuration can include forming a mirror region, forming an active region over the mirror region, and forming a blocking region over the active region. The formations can be by MOCVD. In one example, the structure can include an undoped blocking layer (e.g., InGaP, such as $In_{0.48}Ga_{0.52}P$), which is lattice matched to GaAs and AlGaAs. The blocking layer is not subject to aggressive oxidation in air that interferes with MOCVD based re-growth. Thus, the use of MOCVD can be beneficial for forming the heterojunction conductive channel configuration.

The blocking layer is removed by wet chemical etch to form an aperture. After etching the aperture in the blocking region (which aperture is a recess with the active region or top confining region as its base with the blocking region as the side walls extending from the base), a conductive channel core is formed in the etched aperture by planarizing regrowth using a higher index of refraction material (compared to the blocking region), such as $Al_{0.15}Ga_{0.85}As$. The planarizing regrowth is performed to fill the etched aperture with the conductive channel core, and then to form any optional regions (e.g., conductive plane with wings) and mirror regions over the etched region. The planarizing regrowth is implemented by selection of MOCVD growth parameters to obtain higher attainable growth rates inside the aperture. A selective area regrowth, followed by a top P-doped mirror (e.g., distributed Bragg reflector—DBR) growth can also be used to achieve planarization. When the bottom mirror is P-doped the top mirror can be N-doped and the other layers of the VCSEL correspondingly formulated.

In one embodiment, the present VCSEL can be configured to include a center conductive channel formed by etching the blocking region away, and having the etched region filled with a conducting region and then having a subsequent series of planarizing layers deposited on top of the blocking region and conductive region to form an index guided optical mode.

In one embodiment, a single substrate can include a plurality of conductive regions, which can be formed into an array. A macro substrate with a macro blocking region can be selectively etched and refilled with conductive channels in a number of locations to form the array of conductive regions. Each conductive channel can be an individual light emitting device or combined as a single light emitting device, either of which use a heterojunction current blocking region and an etched conductive channel, and the entirety of the conductive channels and blocking regions can receive subsequent regrowth thereof with planarizing layers.

The present configuration can result in a VCSEL devoid of an oxide aperture because the processing does not use lateral oxidation that can damage the semiconductor layers.

The use of the blocking layer with conductive channel uses semiconductor material with better thermal connectivity. The thermal conductivity is better because of aluminum arsenide layers in the top mirror, and processing does not oxidize them. The bottom mirror can use binary materials. The reliability of the VCSEL can also be increased because the manufacturing method does not include cutting a trench near the active region and oxidizing into the semiconductor.

Reliability of the VCSEL can be improved when the device operates at lower temperatures. In the current state of the art, the oxide confined VCSEL heats more because of the low thermal conductivity of the oxide layer. Trenches are cut in the device to allow the oxide layer to form. As such, the VCSELs provided herein can be devoid of such an oxide layer and/or trenches that allow oxide layers to form.

Most of the problems with laser device reliability are related to some kind of chemical process being set in motion at the tip of that oxidation layer. Some reliability problems occur at the oxide tip because of the stress induced by the oxide layer. Most reliability problems are exacerbated at high temperatures. The oxide confined lasers have reliability problems as a result of physical interaction with an oxidation layer, where stress at the oxidation layer drives defects to form in semiconductor layers. In view thereof, it is expected that the lasers described herein should have less defects and less defect formation even at higher temperatures by lacking the oxide layers. The present implant VCSELs can have improved reliability by not having the oxide layer.

Now with the present technology, very small apertures can be formed in a blocking layer and filled with the conductive region to form one or more laser devices with improved reliability. The very small aperture laser devices can now be very close to each other so as to be operated together for the single non-functional mode, or operated separately, or as laser-monitor, or as laser-modulator configurations. For example, the individual conductive channels can have a diameter (or other cross-dimensions) of from about 0.5 microns or greater, or 0.75 microns or greater, or 1 micron to 10 microns, from 1.5 microns to 5 microns, from 2 microns to 4 microns, or about 2.5-3 microns. The individual conductive channels can be separated by distances (e.g., minimum distance apart) from 1 micron to 10 microns, from 1.5 microns to 5 microns, from 2 microns to 4 microns, or about 2.5-3 microns. This can include 1, 2, 3, 4, 5, 6, 7, 8, 9, 10, or more conductive channels on a common chip, where one or more (e.g., 4 or 5) can be coupled into a common optical fiber with a common optical field.

Common to chemical etching, a mask can be used to define the etching part and non-etching part. A mask or other chemical blocking material can be placed on the blocking layer with apertures defining where the chemical etch will occur. In one example, MOCVD deposition is used to form the conductive channel core. In one example, the non-etching region is defined by placing a layer of $SiO_2$ everywhere on the blocking layer except for leaving the one or more holes (circular or other shape) that is the aperture. Then the $SiO_2$ is removed. After removing the $SiO_2$ then MOCVD fills the holes with the higher refractive index material to form the conductive channel cores. Then the conductive channel core is flattened out by adding additional higher refractive index material to form the layer with wings. The mirror can then be formed over the isolating region.

In one embodiment, the temperature of the MOCVD process can be modulated while filling the aperture during the regrowth and can result in more material growing in the hole and then it planarizes later. The temperature of the regrowth process can determine how much planarization occurs.

In one aspect, the manufacturing process omits etching or otherwise forming a mesa. Accordingly, the laser device does not include a raised area in the center of where the laser will be.

In one embodiment, the blocking region is InGaP. And that material, is 48% I, 52% Ga, along with P. This InGaP material is lattice matched to GaAs.

The process can include growing a first mirror region having a plurality of first mirror layers having one or more indices of refraction and then (optionally) growing a first spacer region over the first mirror region. Then an active region is grown over the first spacer region (or over the first mirror when a first spacer region not grown). Then an optional second spacer region is grown over the active region. Then a blocking region is grown over the second spacer region (or the active region when the second spacer region is not grown). Then etching one or more apertures in the blocking region (only the blocking region is etched, the active region is not etched, optionally some or all of the second blocking region can be etched). Then the one or more apertures are filled with a high refractive index material (e.g., higher RI than the blocking layer) to form the conductive channel core. The process can also include planarizing the conductive channel core, such as by forming the wings, and then growing a second mirror region having a plurality of second mirror layers having one or more indices of refraction.

Also, the active region or whole semiconductor layers of a VCSEL can be produced with molecular beam epitaxy (MBE). Lower growth temperatures during the MBE can be used to prepare the VCSEL semiconductor layers. The growth of these structures by MBE can be performed at <(less than) 500° C. Comparatively, the temperatures for MOCVD can be >(greater than) 600° C. Additionally, the VCSELs can be prepared by methods that are similar to MBE, such as GSMBE (gas source MBE) and MOMBE (metalorganic MBE) or the like that can produce the regions as described.

The chemical etching can be any that is useful and known in the art.

In one embodiment, the orientation of the blocking region and conductive region can be swapped, such that the blocking region is the core surrounded by the conductive region. Here, the conductive region includes an aperture having the blocking core.

In one embodiment, the lack of trenches and oxidation can result in the conductive cores (or central blocking region) being closer together than prior devices. Prior devices, due to trenches and oxidation, can have the cores (conductive or blocking) at about 21 to 25 microns apart, in an example. However, because the current device omits the trenches and oxidation, the cores (conductive or blocking) can be much closer together, such as 4 microns, or from 2-6 microns, or from 1-8 microns apart (center to center).

Now, with cores center to center at about 4 microns, for example, high density arrays can be achieved. The high density can allow for coherent arrays with cores with the same phase. Also, there can be some control of coherence of beams in a phased array, which can focus down to a small spot for use in scanning. Additionally, more precise control of the high density array allows for laser weaponry to use the high density arrays achieved with the present technology.

The technology can allow coherent arrays, which means that all of the cores have the same phase or that you can control the phase between the cores, which can provide a laser beam that can be pointed to a desired location without physically turning the laser. In an example, in a fighter plane there is a phased array in the nose that illuminates another fighter plane, and thereby the phased array can point anywhere. Control of the coherence of the beam of a phased array can allow for focus of the beam down to a small spot. Such control allows for the invention to be used in scanning applications. The control may also be useful in a laser weapon because the arrangement can distribute many of the cores over a large area, which can control the heat dissipation, and control of the phases of all of the cores can allow them to be combined, such as by focusing, so that all of the cores work together to combine their power to get a very large amount of power per unit area when focused.

The VCSEL heterojunction conductive channel configuration can be formed to include a heterojunction current blocking region, with a conductive channel formed by laying a conductive layer, protecting a channel region of the conductive region, and implanting the conductive layer around the protected channel region where the implanted region becomes the blocking region. The conductive channel region has a higher refractive index and can be considered to be a conductive channel core when the lateral region is implanted to become a blocking region having a lower refractive index and lower electrical conductivity than the conductive layer. The blocking region can be a lower refractive index perimeter. The refractive index of the blocking region being lowered by implantation can be comparative to the higher refractive index of the conductive channel core. This allows formation of guided optical modes. Now with the heterojunction conductive channel configuration, a VCSEL or VCSEL array can be more readily fabricated using standard MOCVD technology and other standard fabrication techniques that are currently employed in high volume VCSEL manufacturing.

In one embodiment, a method of manufacture of the VCSEL with the heterojunction conductive channel configuration can include forming a mirror region, forming an active region over the mirror region, and forming a conductive layer over the active region. The formations can be by MOCVD.

The conductive layer can then receive an implant blocking photoresist over a blocked region of the conductive layer, which becomes the conductive channel core. The process then includes using implantation, such as low energy, or low dose implantation to change the unblocked region into a current blocking region.

The blocking layer is not subject to aggressive oxidation in air that interferes with MOCVD based re-growth. Thus, the use of MOCVD can be beneficial for forming the heterojunction conductive channel configuration.

With the photoresist still in place, a portion of the blocking layer is removed by wet chemical etch. The entire blocking layer is not etched so that the blocking layer with reduced height or thickness is retained. Before etching, the blocking layer can have a height or thickness, and after etching can have a height or thickness that is 10%, 25%, 50%, 75%, 80%, or 90% of the height or thickness before etching.

In one example, the conductive layer and conductive channel core can be $Al_{0.15}Ga_{0.85}As$.

After etching and removing the photoresist, non-planarizing regrowth is performed to form the mirror regions. The non-planarizing regrowth is implemented by a selection of MOCVD growth parameters to obtain higher attainable growth rates. The conductive channel core being a mesa compared to the blocking layer results in non-planarizing regrowth so that each mirror layer has a step at the conductive channel core. This can achieve the top mirror depending on whether the steps are connected or disconnected. When the bottom mirror is P-doped the top mirror can be N-doped and the other layers of the VCSEL correspondingly formulated.

In one embodiment, a single substrate can include a plurality of conductive regions, which can be formed into an array of individual emitters or as a single emitter for a single non-fundamental mode. A macro substrate with a macro conductive layer can be protected with a plurality of photoresists, implanted at the non-protected regions to form the blocking regions, etching the implanted blocking regions, and then forming non-planarized mirror layers above the stepped implanted blocking regions and non-implanted conductive channel cores. The number of locations having the photoresist protecting against implantation and etching can define the number of light emitting regions in the array of VCSELs. Each conductive channel core can be an individual light emitting device that uses a heterojunction current blocking region (implanted and etched) and a stepped up center conductive channel, and the entirety of the stepped up conductive channels and blocking regions can receive subsequent regrowth thereof with non-planarizing layers.

The present configuration can result in a VCSEL devoid of an oxide aperture because the processing does not use lateral oxidation that can damage the semiconductor layers. The use of the blocking layer with conductive channel core uses semiconductor material with better thermal connectivity. The thermal conductivity is better because of aluminum arsenide layers in the top mirror, and processing does not oxidize them. The bottom mirror can use binary materials. The reliability of the VCSEL can also be increased because the manufacturing method does not include cutting a trench near the active region and oxidizing into the semiconductor.

Reliability of the VCSEL can be improved when the device operates at lower temperatures. In the current state of the art, the oxide confined VCSEL heats more because of the low thermal conductivity of the oxide layer. Trenches are cut in the device to allow the oxide layer to form. As such, the VCSELs provided herein can be devoid of such an oxide layer and/or trenches that allow oxide layers to form.

Most of the problems with laser device reliability are related to some kind of chemical process being set in motion at the tip of that oxidation layer. Some reliability problems occur at the oxide tip because of the stress induced by the oxide layer. Most reliability problems are exacerbated at high temperatures. The oxide confined lasers have reliability problems as a result of physical interaction with an oxidation layer, where stress at the oxidation layer drives defects to form in semiconductor layers. In view thereof, it is expected that the lasers described herein should have less defects and less defect formation even at higher temperatures by lacking the oxide layers. The present implant VCSELs can have improved reliability by not having the oxide layer.

Now with the present technology, very small stepped up conductive channel cores can be formed by the etched stepped down blocking layer to form one or more laser devices with improved reliability. The very small stepped up conductive channel cores can now be very close to each other. For example, the individual conductive channel cores can have a diameter (or other cross-dimensions) of greater than or about 0.5 microns, greater than or about 0.75 microns, from 1 micron to 10 microns, from 1.5 microns to 5 microns, from 2 microns to 4 microns, or about 2.5-3 microns. The individual conductive channel cores can be separated by distances (e.g., minimum distance apart) from 1 micron to 10 microns, from 1.5 microns to 5 microns, from 2 microns to 4 microns, or about 2.5-3 microns. This can include 1, 2, 3, 4, 5, 6, 7, 8, 9, 10, or more lasers on a common chip, where one or more (e.g., 4 or 5) can be coupled into a common optical fiber.

In one embodiment, the device can include a shallow implant. The shallow implant can be effective in terms of current blocking capability. It also is sort of a geometrical stability and the real new technology here is re-growing on top of the shallow implant.

Common to chemical etching, a mask can be used to define the etching part and non-etching part. A mask or other chemical blocking material can be placed on the stepped up conductive channel cores defining where the chemical etch will not occur. In one example, MOCVD deposition is used to form the conductive channel core.

The process can include growing a first mirror region having a plurality of first mirror layers having one or more indices of refraction and then (optionally) growing a first spacer region over the first mirror region. Then an active region is grown over the first spacer region (or over the first mirror when a first spacer region is not grown). Then a conductive region is grown over the active region. Then a resist layer is formed over a region of the conductive region. Next is performing implantation of a region of the conductive region that does not have the resist layer, where the implanted regions become the blocking region. Then etching the blocking region from a first thickness to a shorter second thickness. Then the resist layer is removed to form the conductive channel core having a higher step level than the blocking region (e.g., forming the conductive channel core as a mesa compared to the blocking region). The process can also include growing a second mirror region having a plurality of non-planarized second mirror layers having one or more indices of refraction, wherein the non-planarized second mirror layers have a connected or disconnected step.

Also, the active region or whole semiconductor layers of a VCSEL can be produced with molecular beam epitaxy (MBE). Lower growth temperatures during the MBE can be used to prepare the VCSEL semiconductor layers. The growth of these structures by MBE can be performed at <(less than) 500° C. Comparatively, the temperatures for MOCVD can be >(greater than) 600° C. Additionally, the VCSELs can be prepared by methods that are similar to MBE, such as GSMBE (gas source MBE) and MOMBE (metalorganic MBE) or the like that can produce the regions as described.

The implantation and chemical etching can be any that is useful and known in the art.

In one embodiment, the VCSEL having the stepped up conductive channel core over the blocking region can be prepared by forming an ion implanted current blocking region. The conductive channel core is formed by blocking the implantation with photoresist. The conductive channel core has a higher refractive index.

Also, the region of higher effective refractive index from the shallow etch allows the guided mode formation. Without the etch, the processing can result in an implant only structure, similar to the first commercial VCSELs used. These devices have high threshold, irregular optical modes, as well as low speed and low wall plug efficiency. The shallow etch described herein can allow the device to be guided. The shallow edge allows the higher refractive index.

The blocking region is then shortened (etched to have a shorter height) by a shallow etch (before removing the photoresist). P-DBR mirrors are then re-grown on top of this structure to form the non-planarized mirror layers having the step up. The device can be fabricated using standard MOCVD technology, and standard implantation and etching techniques employed in high volume VCSEL manufacturing.

In one embodiment, an effective low dose, high ion mass implant process does not interfere with regrowth enough or severely compromise device performance. In one example, Si ions can be used during implantation for conversion of the blocking layer to N-type, or oxygen for blocking based on crystal damage. In one example, the blocking region can be N-type compared to P-type conductive channel core. In one example, the blocking region can be damaged relative to the undamaged conductive channel core.

The range of implant dose, energy, and species may be varied as described herein.

In one embodiment, the implant can be an N dopant. An N dopant may require activation. For example, Si is most commonly used as an N dopant; however, S and Se are other possibilities. In one example, implementation of an N implant requires high temperature annealing, such as >850° C. for activation. Implant damage is also eliminated in this process. When using Si and activating it as a dopant, the implant blocks current by forming a reverse bias PN junction. However, the semiconductor crystal is not damaged with Si as the implant, and may result in the implant region being more transmitting. When the implant substance is Si, then the GaAs or AlGaAs in the conductive layer can be converted from a P-type semiconductor to an N-type semiconductor.

In another embodiment, for a blocking approach, heavier ions whose damage do not anneal out during regrowth are used for the implant. Examples of such implants can include O, B, or F. The use of O, B, or F as implants can cause damage to the semiconductor that turns it into an insulator. In one aspect after using O, B, or F as implants, the semiconductor can be analyzed to determine if the crystal is overly damaged, and if not overly damaged, then further crystal growth (e.g., regrowth) can be performed over the implanted region.

In one embodiment, the junction between the conductive channel core and blocking regions may not be a heterojunction. The blocking region can be an implanted region that is then etched to be shorter or have a smaller thickness compared to the conductive channel core. The etch can result in the conductive channel core being a mesa extending above the blocking region.

In one embodiment, the implant in the isolation region and blocking region is not a proton implant.

It is noted that the same photoresist can block the implantation and block etching.

The non-planarized layers can be completely offset or minimally offset. That is, the offset can be 10%, 20%, 30%, 40%, 50%, 60%, 70%, 80%, 90%, or 100% (completely offset). The offset provides for causing optical guiding in the center region above these stepped up layers.

In one embodiment, the device manufactured as described herein is not an intercavity contacted device. This can include the device being prepared without significant doping in the center and high loss accompanied therewith. The present device can have higher heat dissipation without the intercavity contact.

In one embodiment, the structure for the top mirror can also be included in the bottom mirror. Correspondingly, the methodology for manufacturing the isolation region and stepped layers thereover can be performed for the bottom mirror, with the alteration of the methods being employed over the substrate rather than the active region. Also, the method recited herein can be modified to be implemented on the substrate with the bottom mirror instead of over the active region with the top mirror.

However, it should be recognized that the procedures can be applied to both the top mirror and bottom mirror to form the non-planarized layers (P or N).

In one embodiment, the blocking region can be in the bottom mirror only, top mirror only, or bottom and top mirrors.

To form a lower isolation region, the process can include growing a portion of a first mirror region having a plurality of first mirror layers having one or more indices of refraction, which can be conductive. Then a resist layer is formed over a region of the portion of a first mirror region (e.g., conductive region). Performing implantation of a region of the portion of a first mirror region that does not have the resist layer, where the implanted regions become the blocking region. Then etching the blocking region from a first thickness to a shorter second thickness. Then the resist layer is removed to form the conductive channel core having a higher step level than the blocking region (e.g., forming the conductive channel core as a mesa compared to the blocking region). The process can also include growing a second portion of the first mirror region having a plurality of non-planarized second mirror layers having one or more indices of refraction, wherein the non-planarized second mirror layers have a connected or disconnected step. Then (optionally) growing a first spacer region over the first mirror region. Then an active region is grown over the first spacer region (or over a first mirror when a first spacer region is not grown). Then a conductive region is grown over the active region. Then, a second mirror region is grown with or without forming the blocking region and conductive channel in the second mirror region.

In one embodiment, the processing can include fabrication of the semiconductor to grow the semiconductor layers in a reactor. Then, the semiconductor is taken out of the reactor and the blocking region is implanted and etched as described herein. After implanting and etching, the implanted semiconductor is placed in the reactor for further growth of a semiconductor, which results in the non-planarized semiconductor layers above the implanted and etched blocking region and conductive channel. The second semiconductor growth over the implanted and etched blocking region and conductive channel can be considered to be regrowth. This regrowth can be performed whether the isolation region having the implanted and etched blocking region and conductive channel is under or over the active region. For example, when the isolation region is over the substrate and under the active region, the regrowth can be performed to form the lower non-planarized semiconductor layers, such as the non-planarized bottom mirror. In another example, when the isolation region is over the active region, the regrowth can be performed to form the upper non-planarized semiconductor layers, such as the non-planarized top mirror. Additionally, such manufacturing can be performed to have non-planarized semiconductor layers over both the bottom isolation region and top isolation region.

In one embodiment, whether the non-planarized semiconductor layers are over a bottom isolation region and/or over a top isolation region, a planarizing layer can be prepared to flatten out the structure for later planarized layers, if present. The non-planarized semiconductor layers may have a planarizing layer placed thereover, or the top region of the non-planarized layer can be selectively etched to become planar or selectively grown so as to become planarized (e.g., using masks or photoresist over the layer that is not grown for the planarization).

In one embodiment, the semiconductors, including the active region and others, can be non-planarized when grown over a non-planarized region. As such, the non-planarized regions shown in the figures may be continued in all semiconductor layers formed over the non-planarized region. For example, when the isolation region is under the active region, all regions over the isolation region including the active region may be non-planarized.

In one embodiment, the blocking region can be in the middle surrounded by the conductive channel, which would be annular around the blocking region.

In one embodiment, the lack of trenches and oxidation can result in the conductive cores (or central blocking region) being closer together than prior devices. Prior devices, due to trenches and oxidation, can have the cores (conductive or blocking) at about 21 to 25 microns apart, in an example. However, because the current device omits the trenches and oxidation, the cores (conductive or blocking) can be much closer together, such as 4 microns, or from 2-6 microns, or from 1-8 microns apart (center to center).

Now, with cores center to center at about 4 microns, for example, high density arrays can be achieved. The high density can allow for coherent arrays with cores with the same phase. Also, there can be some control of coherence of beams in a phased array, which can focus down to a small spot for use in scanning. Additionally, more precise control of the high density array allows for laser weaponry to use the high density arrays achieved with the present technology.

The technology can allow coherent arrays, which means that all of the cores have the same phase or that you can control the phase between the cores, which can provide a laser beam that can be pointed to a desired location without physically turning the laser. In an example, in a fighter plane there is a phased array in the nose that illuminates another fighter plane, and thereby the phased array can point anywhere. Control of the coherence of the beam of a phased array can allow for focus of the beam down to a small spot. Such control allows for the invention to be used in scanning applications. The control may also be useful in a laser weapon because the arrangement can distribute many of the cores over a large area, which can control the heat dissipation, and control of the phase of all of the cores can allow them to be combined, such as by focusing, so that all of the cores work together to combine their power to get a very large amount of power per unit area when focused.

Typically, lasers include the P regions in the upper portion of the laser and the N regions in the lower portion of the laser, relative to the active region. However, there can be advantages with the N region being in the upper portion and the P region being in the lower portion, relative to the active region. As such, the devices described herein can be configured with either of these orientations. The lower region is grown on the substrate before the upper region is grown over the lower region.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety. U.S. No. 2018/0090909 (Ser. No. 15/718,342) filed Sep. 28, 2017 and 2018/0041009 (Ser. No. 15/671,433) filed Aug. 8, 2017 are incorporated herein by specific reference in their entirety.

The invention claimed is:

1. A vertical cavity surface emitting laser (VCSEL) comprising:
   an active region configured to emit light;
   a blocking region over or under the active region, the blocking region defining a plurality of channels therein;
   a plurality of conductive channel cores in the plurality of channels of the blocking region, wherein the plurality of conductive channel cores and blocking region form an isolation region;
   a photodetector;
   a waveguide extending between and optically coupling the active region and the photodetector;
   a top electrical contact; and
   a bottom electrical contact electrically coupled with the top electrical contact through the active region and plurality of conductive channel cores,
   wherein the plurality of conductive channel cores are located between and electrically coupled with the top electrical contact and bottom electrical contact, and optically coupled so as to form a common light emitter that emits light from the plurality of conductive channel cores.

2. The VCSEL of claim 1, wherein the conductive channel core has a diameter of about 0.5 microns to about 10 microns.

3. The VCSEL of claim 1, comprising a plurality of different sets of the plurality of the conductive channel cores in a common blocking region, the plurality of conductive channel cores of each set are electrically coupled with a common electrical source and optically coupled so as to form a common light emitter that emits light from the plurality of conductive channel cores, wherein the conductive channel cores of different sets are electronically isolated and operated separately.

4. The VCSEL of claim 1, comprising:
the blocking region having a first thickness; and
the plurality of conductive channel cores having a second thickness that is different than the first thickness, wherein the blocking region is defined by having an implant and the plurality of conductive channel cores are devoid of the implant, wherein the blocking region is lateral to the plurality of conductive channel cores, the blocking region and plurality of conductive channel cores being an isolation region.

5. The VCSEL of claim 4, wherein the implant is silicon or oxygen.

6. The VCSEL of claim 1, wherein the plurality of conductive channel cores includes two or more conductive channel cores in a pattern for a single non-fundamental mode.

7. The VCSEL of claim 6, wherein the pattern is a Languerre-Gaussian profile, a Hermite-Gaussian profile, or an Ince-Gaussian profile.

8. The VCSEL of claim 1, wherein, wherein the waveguide has a rectangular-shaped profile, a bowtie-shaped profile, or a diamond-shaped profile.

9. The VCSEL of claim 1, wherein the photodetector includes a second active region configured for detecting light.

10. The VCSEL of claim 9, wherein the photodetector includes a second blocking region over or under the second active region and lateral of the blocking region, the second blocking region defining one or more second channels therein.

11. The VCSEL of claim 10, wherein the photodetector includes one or more second conductive channel cores in the one or more second channels of the second blocking region, wherein the one or more second conductive channel cores and second blocking region form a second isolation region lateral of the first isolation region.

12. A vertical cavity surface emitting laser (VCSEL) comprising:
a laser emitter having:
a first active region configured to emit light;
a first blocking region over or under the first active region, the first blocking region defining one or more first channels therein; and
one or more first conductive channel cores in the one or more first channels of the first blocking region, wherein the one or more first conductive channel cores and first blocking region form a first isolation region; and
a photodetector configured as a monitor having:
a second active region configured for detecting light;
a second blocking region over or under the second active region and lateral of the first blocking region, the second blocking region defining one or more second channels therein; and
one or more second conductive channel cores in the one or more second channels of the second blocking region, wherein the one or more second conductive channel cores and second blocking region form a second isolation region lateral of the first isolation region; and
a waveguide extending between and optically coupling the laser emitter and photodetector.

13. The VCSEL of claim 12, wherein:
the waveguide extends through the first isolation region and second isolation region between the laser emitter and photodetector;
the waveguide extends through a region above the first isolation region and second isolation region between the laser emitter and photodetector; and/or
the waveguide extends through a region below the first isolation region and second isolation region between the laser emitter and photodetector.

14. The VCSEL of claim 12, wherein, wherein the waveguide has a rectangular-shaped profile, a bowtie-shaped profile, or a diamond-shaped profile.

15. The VCSEL of claim 12, wherein the one or more first conductive channel cores have a diameter of about 0.5 microns to about 10 microns.

16. The VCSEL of claim 12, comprising a plurality of different sets of the one or more first conductive channel cores in a common first blocking region, the one or more first conductive channel cores of each set are electrically coupled with a common electrical source and optically coupled so as to form a common light emitter that emits light from the one or more first conductive channel cores, wherein the one or more first conductive channel cores of the different sets are electronically isolated and operated separately.

17. The VCSEL of claim 12, comprising:
the first blocking region having a first thickness; and
the one or more first conductive channel cores having a second thickness that is different than the first thickness, wherein the first blocking region is defined by having an implant and the one or more first conductive channel cores are devoid of the implant, wherein the first blocking region is lateral to the one or more first conductive channel cores, the first blocking region and one or more first conductive channel cores being an isolation region.

18. The VCSEL of claim 17, wherein the implant is silicon or oxygen.

19. The VCSEL of claim 12, wherein the one or more first conductive channel cores includes a plurality of conductive channel cores in a pattern for a single non-fundamental mode.

20. The VCSEL of claim 19, wherein the non-fundamental mode pattern is a Languerre-Gaussian profile, a Hermite-Gaussian profile, or an Ince-Gaussian profile.

* * * * *